US009096419B2

(12) United States Patent
Chan et al.

(10) Patent No.: US 9,096,419 B2
(45) Date of Patent: Aug. 4, 2015

(54) ELECTROMECHANICAL SYSTEMS DEVICE WITH PROTRUSIONS TO PROVIDE ADDITIONAL STABLE STATES

(71) Applicant: QUALCOMM MEMS Technologies, Inc., San Diego, CA (US)

(72) Inventors: Edward Keat Leem Chan, San Diego, CA (US); Isak Clark Reines, San Diego, CA (US); Bing Wen, Poway, CA (US); Chong Uk Lee, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 402 days.

(21) Appl. No.: 13/632,959

(22) Filed: Oct. 1, 2012

(65) Prior Publication Data
US 2014/0092110 A1  Apr. 3, 2014

(51) Int. Cl.
*G06T 1/00* (2006.01)
*B81B 3/00* (2006.01)
*H01F 7/18* (2006.01)

(52) U.S. Cl.
CPC .............. *B81B 3/0051* (2013.01); *B81B 3/007* (2013.01); *B81B 2201/047* (2013.01); *B81B 2203/0109* (2013.01); *B81B 2203/0163* (2013.01); *H01F 2007/1822* (2013.01); *Y10T 29/49155* (2015.01)

(58) Field of Classification Search
CPC ....................................................... G02B 26/02
USPC .......................................................... 345/501
See application file for complete search history.

(56) References Cited

U.S. PATENT DOCUMENTS

| 5,596,211 A  * | 1/1997  | Onda et al. .................... 257/194 |
| 5,867,202 A    | 2/1999  | Knipe et al. |
| 5,948,981 A  * | 9/1999  | Woodruff ................... 73/514.29 |
| 6,329,738 B1 * | 12/2001 | Hung et al. .................... 310/309 |

(Continued)

FOREIGN PATENT DOCUMENTS

| CN | 1885469 A     | 12/2006 |
| TW | 565708        | 12/2003 |
| WO | 2006036392 A1 | 4/2006  |

OTHER PUBLICATIONS

Cortopassi C., et al., "Nonlinear Springs for Increasing the Maximum Stable Deflection of MEMS Electrostatic Gap Closing Actuators," 2009, 4 pages.

(Continued)

*Primary Examiner* — Javid A Amini
(74) *Attorney, Agent, or Firm* — Weaver Austin Villeneuve & Sampson LLP

(57) ABSTRACT

This disclosure provides systems, methods, and apparatus for an electromechanical systems (EMS) device with one or more protrusions connected to a surface of the EMS device. In one aspect, the EMS device includes a substrate, a stationary electrode over the substrate, and a movable electrode over the stationary electrode. The movable electrode is configured to move to three or more positions across a gap by electrostatic actuation between the movable electrode and the stationary electrode. When the protrusions contact any surface of the EMS device at one of the positions across the gap, the protrusions change the stiffness of the EMS device. At least one of the surfaces in contact with the one or more protrusions is non-rigid. In some implementations, the protrusions have a height greater than about 20 nm.

27 Claims, 16 Drawing Sheets

(56) References Cited

U.S. PATENT DOCUMENTS

| | | | |
|---|---|---|---|
| 6,745,627 B1* | 6/2004 | Woodruff et al. | 73/514.29 |
| 6,806,545 B2* | 10/2004 | Shim | 257/420 |
| 7,245,285 B2* | 7/2007 | Yeh et al. | 345/108 |
| 7,486,854 B2 | 2/2009 | Van Ostrand et al. | |
| 7,532,377 B2 | 5/2009 | Miles | |
| 7,567,373 B2 | 7/2009 | Chui et al. | |
| 7,612,424 B1* | 11/2009 | Espinosa et al. | 257/415 |
| 7,859,740 B2* | 12/2010 | Tung | 359/291 |
| 7,889,416 B1* | 2/2011 | Stowe | 359/291 |
| 8,008,736 B2* | 8/2011 | Kothari | 257/415 |
| 8,270,062 B2* | 9/2012 | Kothari et al. | 359/290 |
| 8,314,984 B2* | 11/2012 | Yang et al. | 359/224.1 |
| 8,884,396 B2* | 11/2014 | Endo | 257/503 |
| 2001/0022546 A1* | 9/2001 | Frey et al. | 333/197 |
| 2003/0169962 A1* | 9/2003 | Rajan et al. | 385/18 |
| 2004/0008400 A1* | 1/2004 | Hill et al. | 359/290 |
| 2005/0089267 A1* | 4/2005 | Ma et al. | 385/18 |
| 2005/0241364 A1* | 11/2005 | Fujiyoshi et al. | 73/1.79 |
| 2006/0290443 A1* | 12/2006 | Chou et al. | 333/105 |
| 2007/0075942 A1* | 4/2007 | Martin et al. | 345/84 |
| 2007/0216987 A1* | 9/2007 | Hagood et al. | 359/298 |
| 2007/0223080 A1* | 9/2007 | Hagood et al. | 359/298 |
| 2007/0236778 A1* | 10/2007 | Malone | 359/299 |
| 2008/0153182 A1* | 6/2008 | Herchen et al. | 438/10 |
| 2008/0278798 A1* | 11/2008 | Hagood et al. | 359/298 |
| 2009/0066299 A1* | 3/2009 | Suzuki | 323/234 |
| 2009/0122380 A1* | 5/2009 | Suzuki | 359/224.1 |
| 2009/0147343 A1* | 6/2009 | Kogut et al. | 359/254 |
| 2009/0244676 A1* | 10/2009 | Uchiyama et al. | 359/225.1 |
| 2009/0322221 A1* | 12/2009 | Makansi | 313/523 |
| 2010/0202032 A1* | 8/2010 | Friese | 359/226.1 |
| 2010/0315696 A1* | 12/2010 | Lee et al. | 359/290 |
| 2011/0120208 A1* | 5/2011 | Ohms et al. | 73/1.38 |
| 2011/0220472 A1* | 9/2011 | Masuda et al. | 200/181 |
| 2012/0060882 A1* | 3/2012 | Makansi | 136/201 |
| 2013/0147313 A1* | 6/2013 | Sachse | 310/300 |
| 2014/0001154 A1* | 1/2014 | Sato et al. | 216/67 |

OTHER PUBLICATIONS

Burns et al., "Nonlinear flexures for stable deflection of an electrostatically actuated micromirror," SPIE vol. 3226, 2011, pp. 125-136.

Taiwan Search Report—TW102134169—TIPO—Nov. 18, 2014.

International Search Report and Written Opinion—PCT/US2013/057963—ISA/EPO—Mar. 20, 2014.

\* cited by examiner

ELECTROMECHANICAL SYSTEMS DEVICE WITH PROTRUSIONS TO PROVIDE ADDITIONAL STABLE STATES

TECHNICAL FIELD

This disclosure relates to electromechanical systems (EMS) and devices and more particularly to engineered structures for stabilizing movable components in interferometric modulators (IMODs).

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term IMOD or interferometric light modulator refers to a device that selectively absorbs and/or reflects light using the principles of optical interference. In some implementations, an IMOD display element may include a pair of conductive plates, one or both of which may be transparent and/or reflective, wholly or in part, and capable of relative motion upon application of an appropriate electrical signal. For example, one plate may include a stationary layer deposited over, on or supported by a substrate and the other plate may include a reflective membrane separated from the stationary layer by an air gap. The position of one plate in relation to another can change the optical interference of light incident on the IMOD display element. IMOD-based display devices have a wide range of applications, and are anticipated to be used in improving existing products and creating new products, especially those with display capabilities.

Many EMS and MEMS devices apply a voltage to generate an electrostatic attraction between two electrodes to cause one electrode to move in relation to the other electrode. The positions of one or both of the electrodes can become unstable as the electrostatic force between the electrodes increases quadratically with decreasing distance between the electrodes. Structures or protrusions can be engineered and connected to portions of the EMS or MEMS device to stabilize the range of motion in the EMS or MEMS device.

SUMMARY

The systems, methods and devices of this disclosure each have several innovative aspects, no single one of which is solely responsible for the desirable attributes disclosed herein.

One innovative aspect of the subject matter described in this disclosure can be implemented in an electromechanical systems (EMS) device. The EMS device can include a substrate; a stationary electrode over the substrate; a movable electrode over the stationary electrode and configured to move to three or more positions across a gap by electrostatic actuation between the movable electrode and the stationary electrode; and a protrusion connected to a surface of the EMS device. The protrusion is configured to change the stiffness of the EMS device when in contact with another surface of the EMS device at one of the positions across the gap, where at least one of the surfaces in contact with the protrusion is non-rigid.

In some implementations, the EMS device can further include a plurality of tethers symmetrically disposed around the edges of the movable electrode, where the protrusion is part of a plurality of protrusions and each of the protrusions is connected to each of the tethers. In some implementations, the protrusion is connected to a surface of the movable electrode facing the stationary electrode. In some implementations, the protrusion is connected to a surface of the substrate facing the movable electrode. In some implementations, the EMS device is an optical device. The EMS device may be part of an analog interferometric modulator (AIMOD). In some implementations, the protrusion has a height greater than about 20 nm. In some implementations, the protrusion is part of a plurality of protrusions, where each of the protrusions has a different height.

Another innovative aspect of the subject matter described in this disclosure can be implemented in an electromechanical systems (EMS) device. The EMS device can include a substrate; a stationary electrode over the substrate; a movable electrode over the stationary electrode and configured to move to three or more positions across a gap by electrostatic actuation between the movable electrode and the stationary electrode; and means for changing the stiffness of the EMS device connected to a surface of the EMS device. The changing stiffness means is configured to contact another surface of the EMS device at one of the positions across the gap, where at least one of the surfaces in contact with the changing stiffness means is non-rigid.

In some implementations, the EMS device can further include means for supporting the movable electrode over the substrate; and means for tethering the movable electrode to the supporting means and symmetrically disposed around the edges of the movable electrode, where the changing stiffness means is connected to tethering means. In some implementations, the changing stiffness means is connected to a surface of the movable electrode facing the stationary electrode. In some implementations, the changing stiffness means is connected to a surface of the substrate facing the movable electrode. In some implementations, the changing stiffness means has a height greater than about 20 nm.

Another innovative aspect of the subject matter described in this disclosure can be implemented in a method of manufacturing an electromechanical systems (EMS) device. The method can include providing a substrate; forming a stationary electrode over the substrate; forming a movable electrode over the stationary electrode, where the movable electrode is configured to move to three or more positions across a gap by electrostatic actuation between the movable electrode and the stationary electrode; and forming a protrusion on a surface of the EMS device. The protrusion on the surface of the EMS device can be configured to change the stiffness of the EMS device when in contact with another surface of the EMS device at one of the positions across the gap, where at least one of the surfaces in contact with the protrusion is non-rigid.

In some implementations, the method can further include forming a plurality of tethers symmetrically disposed around the edges of the movable electrode, where the protrusion is part of a plurality of protrusions and each of the protrusions is connected to each of the tethers. In some implementations, the protrusion is connected to a surface of the movable electrode facing the stationary electrode. In some implementations, the protrusion is connected to a surface of the substrate facing the movable electrode. In some implementations, the protrusion has a height greater than about 20 nm.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays (LCDs), organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
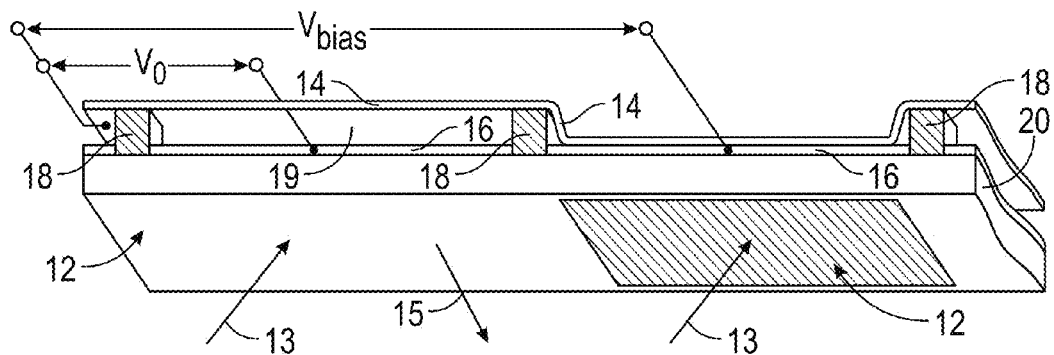
FIG. 1 is an isometric view illustration depicting two adjacent interferometric modulator (IMOD) display elements in a series or array of display elements of an IMOD display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Some implementations described herein relate to EMS devices with one or more protrusions connected to a surface of the EMS device. The EMS device can include a substrate, a stationary electrode over the substrate, and a movable electrode over the stationary electrode. The movable electrode can be configured to move to three or more positions across a gap by electrostatic actuation between the movable electrode and the stationary electrode. When the protrusions contact another surface of the EMS device at one of the positions across the gap, the protrusions can change the stiffness of the EMS device where at least one of the surfaces in contact with the one or more protrusions is non-rigid. The protrusions can each have a height greater than about 20 nm, such as between about 20 nm and about 4000 nm, and such as between about 100 nm and 200 nm. The EMS device can include a plurality of tethers symmetrically disposed around the edges of the movable electrode. Each of the protrusions can be connected to each of the tethers, or connected to a surface of the movable electrode facing the stationary electrode.

Particular implementations of the subject matter described in this disclosure can be implemented to realize one or more of the following potential advantages. Protrusions on a surface of the EMS device can contact another surface of the EMS device to change the overall stiffness of the EMS device during actuation when at least one of the surfaces in contact with the protrusions is non-rigid, leading to a higher restoring force to counter the effects of snap-through. As a result, the protrusions can provide at least an additional stable region of operation. In fact, multiple protrusions of different heights can provide further stable regions of operation. With additional stable regions of operation, some EMS devices including optical EMS devices can provide additional stable color ranges, including black. Furthermore, the protrusions also can provide larger restoring forces to overcome the effects of stiction between the movable electrode and the stationary electrode when the protrusions are in contact.

An example of a suitable EMS or MEMS device or apparatus, to which the described implementations may apply, is a reflective display device. Reflective display devices can incorporate interferometric modulator (IMOD) display elements that can be implemented to selectively absorb and/or reflect light incident thereon using principles of optical interference. IMOD display elements can include a partial optical absorber, a reflector that is movable with respect to the absorber, and an optical resonant cavity defined between the absorber and the reflector. In some implementations, the reflector can be moved to two or more different positions, which can change the size of the optical resonant cavity and thereby affect the reflectance of the IMOD. The reflectance spectra of IMOD display elements can create fairly broad spectral bands that can be shifted across the visible wavelengths to generate different colors. The position of the spectral band can be adjusted by changing the thickness of the optical resonant cavity. One way of changing the optical resonant cavity is by changing the position of the reflector with respect to the absorber.

FIG. 1 is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 1 includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 1, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 1 and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 µm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 1, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 1. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
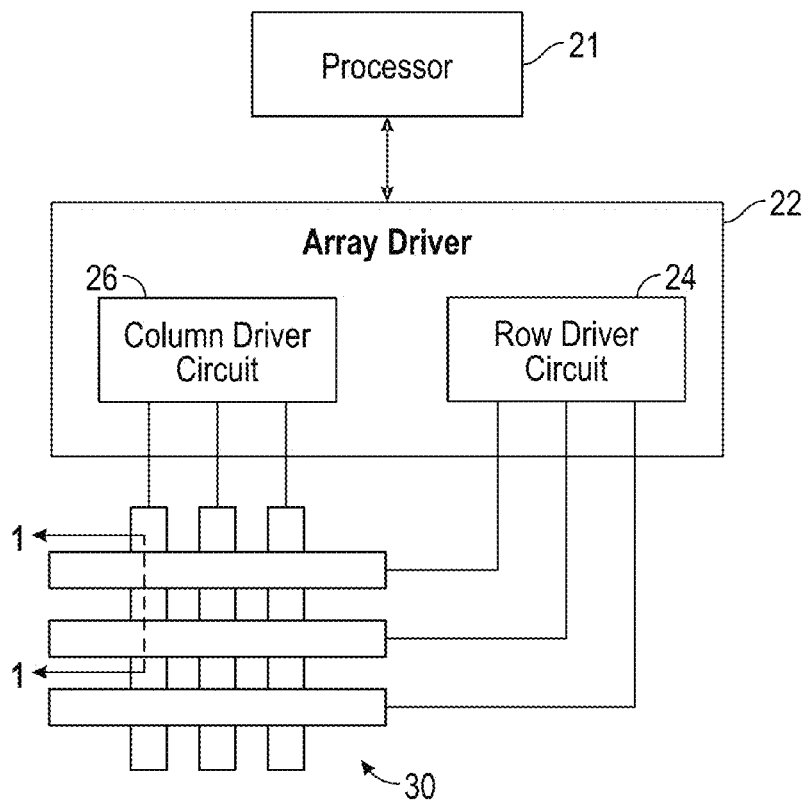
FIG. 2 is a system block diagram illustrating an electronic device incorporating an IMOD-based display including a three element by three element array of IMOD display elements.

FIG. 2 is a system block diagram illustrating an electronic device incorporating an IMOD-based display including a three element by three element array of IMOD display elements. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 1 is shown by the lines 1-1 in FIG. 2. Although FIG. 2 illustrates a 3×3 array of IMOD display elements for the sake of clarity, the display array 30 may contain a very large number of IMOD display elements, and may have a different number of IMOD display elements in rows than in columns, and vice versa.

Figure 3A:
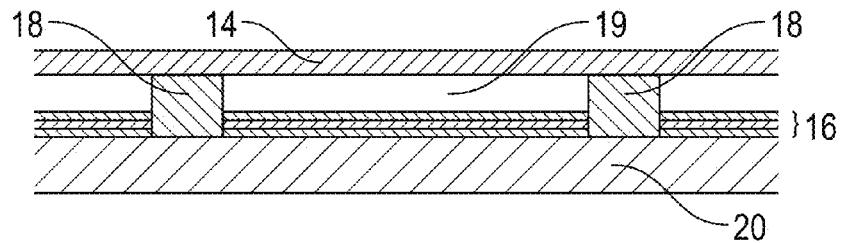
FIGS. 3A-3E are cross-sectional illustrations of varying implementations of IMOD display elements.
Figure 3B:
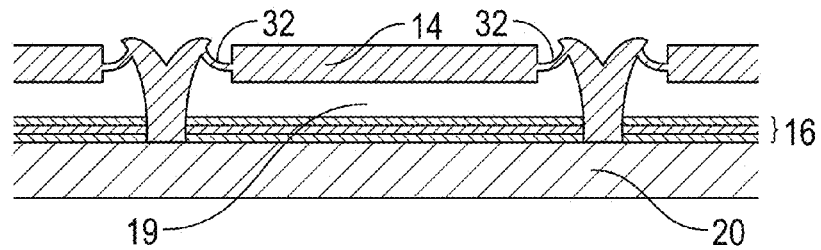
Figure 3C:
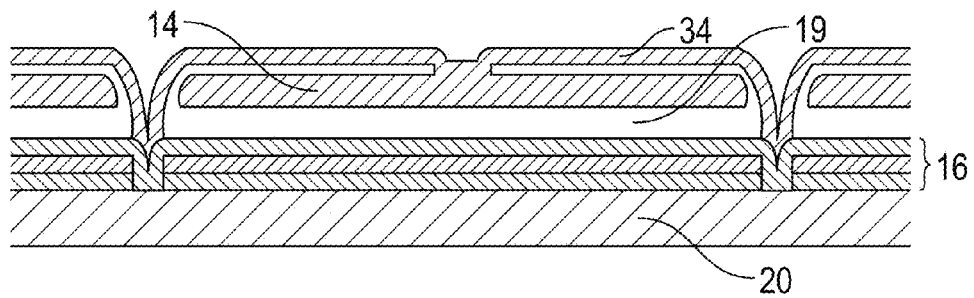

The details of the structure of IMOD displays and display elements may vary widely. FIGS. 3A-3E are cross-sectional illustrations of varying implementations of IMOD display elements. FIG. 3A is a cross-sectional illustration of an IMOD display element, where a strip of metal material is deposited on supports 18 extending generally orthogonally from the substrate 20 forming the movable reflective layer 14. In FIG. 3B, the movable reflective layer 14 of each IMOD display element is generally square or rectangular in shape and attached to supports at or near the corners, on tethers 32. In FIG. 3C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as implementations of "integrated" supports or support posts 18. The implementation shown in FIG. 3C has additional benefits deriving from the decoupling of the optical functions of the movable reflective layer 14 from its mechanical functions, the latter of which are carried out by the deformable layer 34. This decoupling allows the structural design and materials used for the movable reflective layer 14 and those used for the deformable layer 34 to be optimized independently of one another.

Figure 3D:
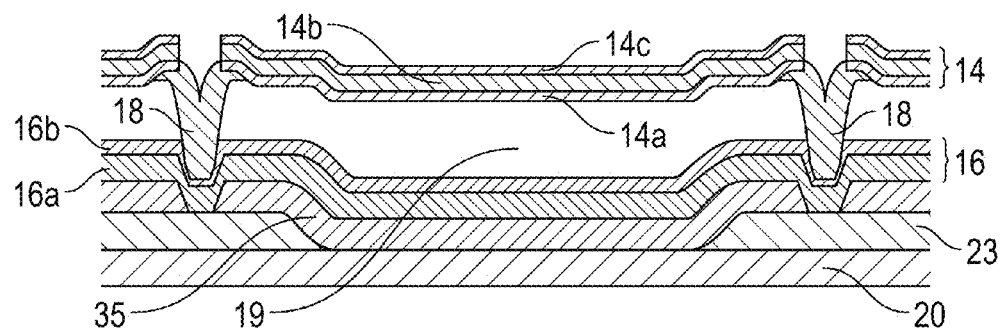

FIG. 3D is another cross-sectional illustration of an IMOD display element, where the movable reflective layer 14 includes a reflective sub-layer 14a. The movable reflective layer 14 rests on a support structure, such as support posts 18. The support posts 18 provide separation of the movable reflective layer 14 from the lower stationary electrode, which can be part of the optical stack 16 in the illustrated IMOD display element. For example, a gap 19 is formed between the movable reflective layer 14 and the optical stack 16, when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, a $SiO_2$/SiON/$SiO_2$ tri-layer stack. Either or both of the reflective sub-layer 14a and the conductive layer 14c can include, for example, an aluminum (Al) alloy with about 0.5% copper (Cu), or another reflective metallic material. Employing conductive layers 14a and 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 3D, some implementations also can include a black mask structure 23, or dark film layers. The black mask structure 23 can be formed in optically inactive regions (such as between display elements or under the support posts 18) to absorb ambient or stray light. The black mask structure 23 also can improve the optical properties of a display device by inhibiting light from being reflected from or transmitted through inactive portions of the display, thereby increasing the contrast ratio. Additionally, at least some portions of the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. In some implementations, the black mask structure 23 can be an etalon or interferometric stack structure. For example, in some implementations, the interferometric stack black mask structure 23 includes a molybdenum-chromium (MoCr) layer that serves as an optical absorber, an $SiO_2$ layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, tetrafluoromethane (or carbon tetrafluoride, $CF_4$) and/or oxygen ($O_2$) for the MoCr and $SiO_2$ layers and chlorine ($Cl_2$) and/or boron trichloride ($BCl_3$) for the aluminum alloy layer. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate electrodes (or conductors) in the optical stack 16 (such as the absorber layer 16a) from the conductive layers in the black mask structure 23.

Figure 3E:
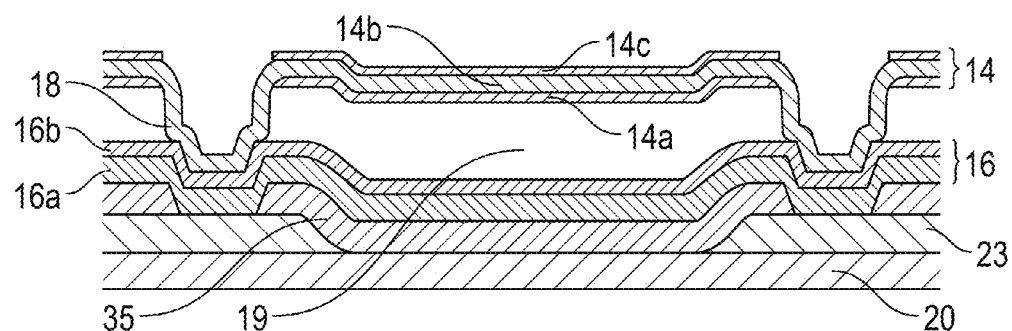

FIG. 3E is another cross-sectional illustration of an IMOD display element, where the movable reflective layer 14 is self-supporting. While FIG. 3D illustrates support posts 18 that are structurally and/or materially distinct from the movable reflective layer 14, the implementation of FIG. 3E includes support posts that are integrated with the movable reflective layer 14. In such an implementation, the movable reflective layer 14 contacts the underlying optical stack 16 at multiple locations, and the curvature of the movable reflective layer 14 provides sufficient support that the movable reflective layer 14 returns to the unactuated position of FIG. 3E when the voltage across the IMOD display element is insufficient to cause actuation. In this way, the portion of the movable reflective layer 14 that curves or bends down to contact the substrate or optical stack 16 may be considered an "integrated" support post. One implementation of the optical stack 16, which may contain a plurality of several different layers, is shown here for clarity including an optical absorber 16a, and a dielectric 16b. In some implementations, the optical absorber 16a may serve both as a stationary electrode and as a partially reflective layer. In some implementations, the optical absorber 16a can be an order of magnitude thinner than the movable reflective layer 14. In some implementations, the optical absorber 16a is thinner than the reflective sub-layer 14a.

In implementations such as those shown in FIGS. 3A-3E, the IMOD display elements form a part of a direct-view device, in which images can be viewed from the front side of the transparent substrate 20, which in this example is the side opposite to that upon which the IMOD display elements are formed. In these implementations, the back portions of the device (that is, any portion of the display device behind the movable reflective layer 14, including, for example, the deformable layer 34 illustrated in FIG. 3C) can be configured and operated upon without impacting or negatively affecting the image quality of the display device, because the reflective layer 14 optically shields those portions of the device. For example, in some implementations a bus structure (not illustrated) can be included behind the movable reflective layer 14 that provides the ability to separate the optical properties of the modulator from the electromechanical properties of the modulator, such as voltage addressing and the movements that result from such addressing.

Figure 4:
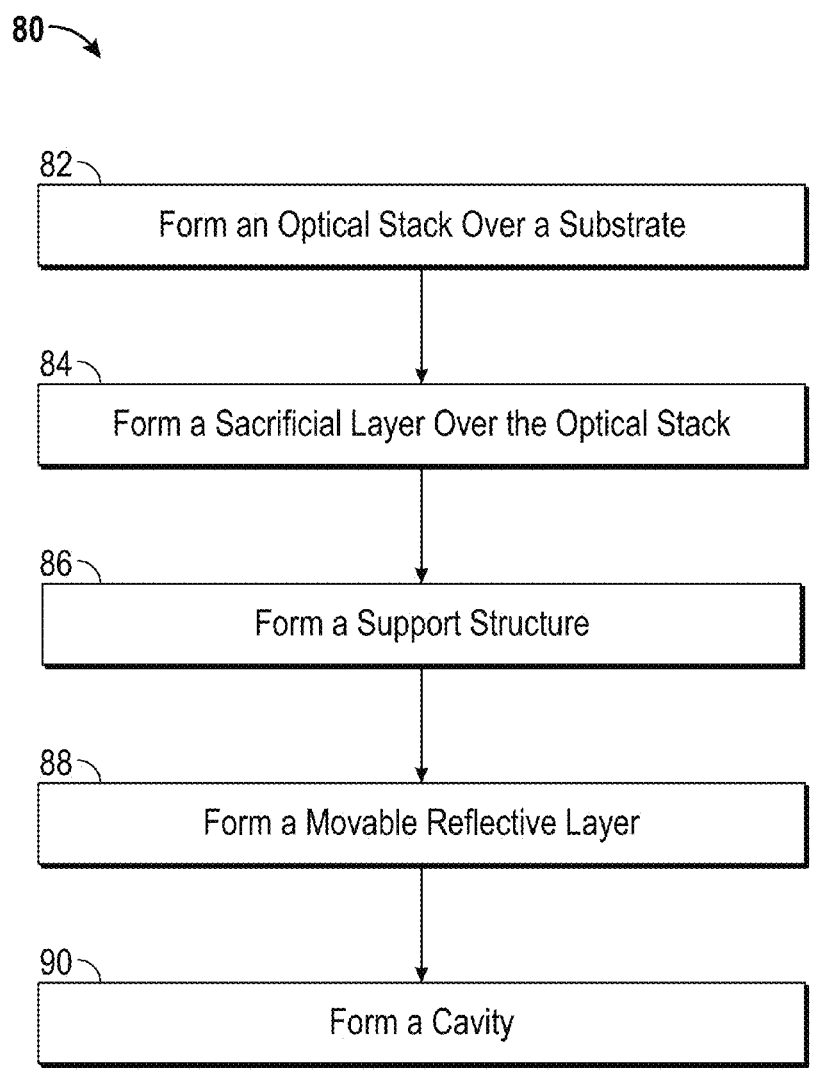
FIG. 4 is a flow diagram illustrating a manufacturing process for an IMOD display or display element.
Figure 5A:
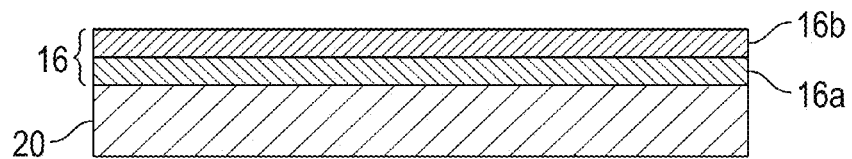
FIGS. 5A-5E are cross-sectional illustrations of various stages in a process of making an IMOD display or display element.

FIG. 4 is a flow diagram illustrating a manufacturing process 80 for an IMOD display or display element. FIGS. 5A-5E are cross-sectional illustrations of various stages in the manufacturing process 80 for making an IMOD display or display element. In some implementations, the manufacturing process 80 can be implemented to manufacture one or more EMS devices, such as IMOD displays or display elements. The manufacture of such an EMS device also can include other blocks not shown in FIG. 4. The process 80 begins at block 82 with the formation of the optical stack 16 over the substrate 20. FIG. 5A illustrates such an optical stack 16 formed over the substrate 20. The substrate 20 may be a transparent substrate such as glass or plastic such as the materials discussed above with respect to FIG. 1. The substrate 20 may be flexible or relatively stiff and unbending, and may have been subjected to prior preparation processes, such as cleaning, to facilitate efficient formation of the optical stack 16. As discussed above, the optical stack 16 can be electrically conductive, partially transparent, partially reflective, and partially absorptive, and may be fabricated, for example, by depositing one or more layers having the desired properties onto the transparent substrate 20.

In FIG. 5A, the optical stack 16 includes a multilayer structure having sub-layers 16a and 16b, although more or fewer sub-layers may be included in some other implementations. In some implementations, one of the sub-layers 16a and 16b can be configured with both optically absorptive and electrically conductive properties, such as the combined conductor/absorber sub-layer 16a. In some implementations, one of the sub-layers 16a and 16b can include molybdenum-chromium (molychrome or MoCr), or other materials with a suitable complex refractive index. Additionally, one or more of the sub-layers 16a and 16b can be patterned into parallel strips, and may form row electrodes in a display device. Such patterning can be performed by a masking and etching process or another suitable process known in the art. In some implementations, one of the sub-layers 16a and 16b can be an insulating or dielectric layer, such as an upper sub-layer 16b that is deposited over one or more underlying metal and/or oxide layers (such as one or more reflective and/or conductive layers). In addition, the optical stack 16 can be patterned into individual and parallel strips that form the rows of the display. In some implementations, at least one of the sub-layers of the optical stack, such as the optically absorptive layer, may be quite thin (e.g., relative to other layers depicted in this disclosure), even though the sub-layers 16a and 16b are shown somewhat thick in FIGS. 5A-5E.

Figure 5B:
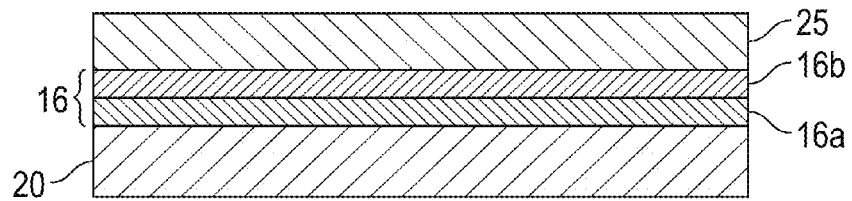

The process 80 continues at block 84 with the formation of a sacrificial layer 25 over the optical stack 16. Because the sacrificial layer 25 is later removed (see block 90) to form the cavity 19, the sacrificial layer 25 is not shown in the resulting IMOD display elements. FIG. 5B illustrates a partially fabricated device including a sacrificial layer 25 formed over the optical stack 16. The formation of the sacrificial layer 25 over the optical stack 16 may include deposition of a xenon difluoride ($XeF_2$)-etchable material such as molybdenum (Mo) or amorphous silicon (Si), in a thickness selected to provide, after subsequent removal, a gap or cavity 19 (see also FIG. 5E) having a desired design size. Deposition of the sacrificial material may be carried out using deposition techniques such as physical vapor deposition (PVD, which includes many different techniques, such as sputtering), plasma-enhanced chemical vapor deposition (PECVD), thermal chemical vapor deposition (thermal CVD), or spin-coating.

Figure 5C:
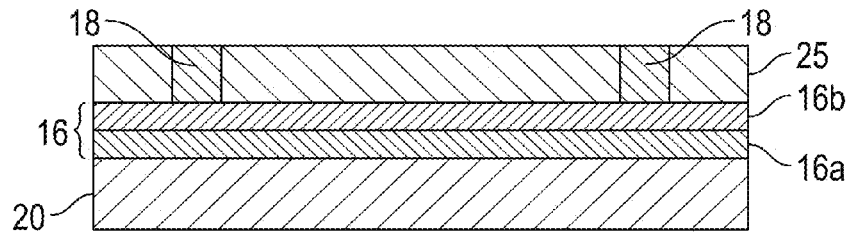

The process 80 continues at block 86 with the formation of a support structure such as a support post 18. The formation of the support post 18 may include patterning the sacrificial layer 25 to form a support structure aperture, then depositing a material (such as a polymer or an inorganic material, like silicon oxide) into the aperture to form the support post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the support post 18 contacts the substrate 20. Alternatively, as depicted in FIG. 5C, the aperture formed in the sacrificial layer 25 can extend through the sacrificial layer 25, but not through the optical stack 16. For example, FIG. 5E illustrates the lower ends of the support posts 18 in contact with an upper surface of the optical stack 16. The support post 18, or other support structures, may be formed by depositing a layer of support structure material over the sacrificial layer 25 and patterning portions of the support structure material located away from apertures in the sacrificial layer 25. The support structures may be located within the apertures, as illustrated in FIG. 5C, but also can extend at least partially over a portion of the sacrificial layer 25. As noted above, the patterning of the sacrificial layer 25 and/or the support posts 18 can be performed by a masking and etching process, but also may be performed by alternative patterning methods.

Figure 5D:
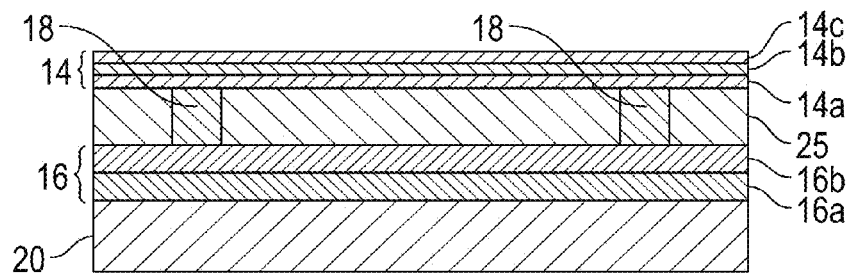
Figure 5E:
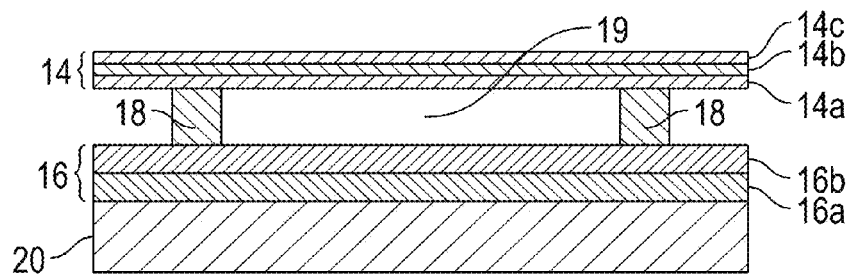

The process 80 continues at block 88 with the formation of a movable reflective layer or membrane such as the movable reflective layer 14 illustrated in FIG. 5D. The movable reflective layer 14 may be formed by employing one or more deposition steps, including, for example, reflective layer (such as aluminum, aluminum alloy, or other reflective materials) deposition, along with one or more patterning, masking and/or etching steps. The movable reflective layer 14 can be patterned into individual and parallel strips that form, for example, the columns of the display. The movable reflective layer 14 can be electrically conductive, and referred to as an electrically conductive layer. In some implementations, the movable reflective layer 14 may include a plurality of sub-layers 14a, 14b and 14c as shown in FIG. 5D. In some implementations, one or more of the sub-layers, such as sub-layers 14a and 14c, may include highly reflective sub-layers selected for their optical properties, and another sub-layer 14b may include a mechanical sub-layer selected for its mechanical properties. In some implementations, the mechanical sub-layer may include a dielectric material. Since the sacrificial layer 25 is still present in the partially fabricated IMOD display element formed at block 88, the movable reflective layer 14 is typically not movable at this stage. A partially fabricated IMOD display element that contains a sacrificial layer 25 also may be referred to herein as an "unreleased" IMOD.

The process 80 continues at block 90 with the formation of a cavity 19. The cavity 19 may be formed by exposing the sacrificial material 25 (deposited at block 84) to an etchant. For example, an etchable sacrificial material such as Mo or amorphous Si may be removed by dry chemical etching by exposing the sacrificial layer 25 to a gaseous or vaporous etchant, such as vapors derived from solid $XeF_2$ for a period of time that is effective to remove the desired amount of material. The sacrificial material is typically selectively removed relative to the structures surrounding the cavity 19. Other etching methods, such as wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD display element may be referred to herein as a "released" IMOD.

In some implementations, the packaging of an EMS component or device, such as an IMOD-based display, can include a backplate (alternatively referred to as a backplane, back glass or recessed glass) which can be configured to protect the EMS components from damage (such as from mechanical interference or potentially damaging substances). The backplate also can provide structural support for a wide range of components, including but not limited to driver circuitry, processors, memory, interconnect arrays, vapor barriers, product housing, and the like. In some implementations, the use of a backplate can facilitate integration of components and thereby reduce the volume, weight, and/or manufacturing costs of a portable electronic device.

Figure 6A:
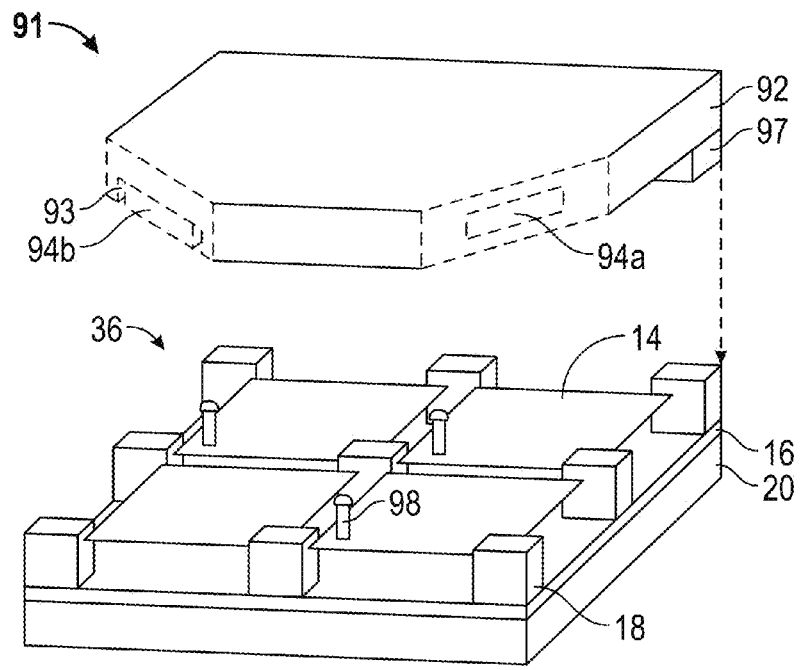
FIGS. 6A and 6B are schematic exploded partial perspective views of a portion of an electromechanical systems (EMS) package including an array of EMS elements and a backplate.
Figure 6B:
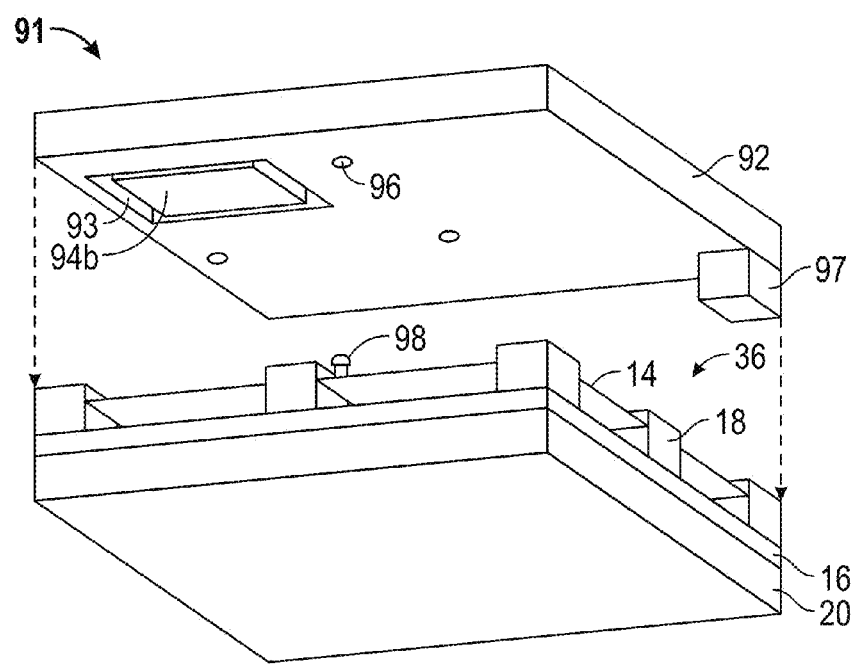

FIGS. 6A and 6B are schematic exploded partial perspective views of a portion of an EMS package 91 including an array 36 of EMS elements and a backplate 92. FIG. 6A is shown with two corners of the backplate 92 cut away to better illustrate certain portions of the backplate 92, while FIG. 6B is shown without the corners cut away. The EMS array 36 can include a substrate 20, support posts 18, and a movable layer 14. In some implementations, the EMS array 36 can include an array of IMOD display elements with one or more optical stack portions 16 on a transparent substrate, and the movable layer 14 can be implemented as a movable reflective layer.

The backplate 92 can be essentially planar or can have at least one contoured surface (e.g., the backplate 92 can be formed with recesses and/or protrusions). The backplate 92 may be made of any suitable material, whether transparent or opaque, conductive or insulating. Suitable materials for the backplate 92 include, but are not limited to, glass, plastic, ceramics, polymers, laminates, metals, metal foils, Kovar and plated Kovar.

As shown in FIGS. 6A and 6B, the backplate 92 can include one or more backplate components 94a and 94b, which can be partially or wholly embedded in the backplate 92. As can be seen in FIG. 6A, backplate component 94a is embedded in the backplate 92. As can be seen in FIGS. 6A and 6B, backplate component 94b is disposed within a recess 93 formed in a surface of the backplate 92. In some implementations, the backplate components 94a and/or 94b can protrude from a surface of the backplate 92. Although backplate component 94b is disposed on the side of the backplate 92 facing the substrate 20, in other implementations, the backplate components can be disposed on the opposite side of the backplate 92.

The backplate components 94a and/or 94b can include one or more active or passive electrical components, such as transistors, capacitors, inductors, resistors, diodes, switches, and/or integrated circuits (ICs) such as a packaged, standard or discrete IC. Other examples of backplate components that can be used in various implementations include antennas, batteries, and sensors such as electrical, touch, optical, or chemical sensors, or thin-film deposited devices.

In some implementations, the backplate components 94a and/or 94b can be in electrical communication with portions of the EMS array 36. Conductive structures such as traces, bumps, posts, or vias may be formed on one or both of the backplate 92 or the substrate 20 and may contact one another or other conductive components to form electrical connections between the EMS array 36 and the backplate components 94a and/or 94b. For example, FIG. 6B includes one or more conductive vias 96 on the backplate 92 which can be aligned with electrical contacts 98 extending upward from the movable layers 14 within the EMS array 36. In some implementations, the backplate 92 also can include one or more insulating layers that electrically insulate the backplate components 94a and/or 94b from other components of the EMS array 36. In some implementations in which the backplate 92 is formed from vapor-permeable materials, an interior surface of backplate 92 can be coated with a vapor barrier (not shown).

The backplate components 94a and 94b can include one or more desiccants which act to absorb any moisture that may enter the EMS package 91. In some implementations, a desiccant (or other moisture absorbing materials, such as a getter) may be provided separately from any other backplate components, for example as a sheet that is mounted to the backplate 92 (or in a recess formed therein) with adhesive. Alternatively, the desiccant may be integrated into the backplate 92. In some other implementations, the desiccant may be applied directly or indirectly over other backplate components, for example by spray-coating, screen printing, or any other suitable method.

In some implementations, the EMS array 36 and/or the backplate 92 can include mechanical standoffs 97 to maintain a distance between the backplate components and the display elements and thereby prevent mechanical interference between those components. In the implementation illustrated in FIGS. 6A and 6B, the mechanical standoffs 97 are formed as posts protruding from the backplate 92 in alignment with the support posts 18 of the EMS array 36. Alternatively or in addition, mechanical standoffs, such as rails or posts, can be provided along the edges of the EMS package 91.

Although not illustrated in FIGS. 6A and 6B, a seal can be provided which partially or completely encircles the EMS array 36. Together with the backplate 92 and the substrate 20, the seal can form a protective cavity enclosing the EMS array 36. The seal may be a semi-hermetic seal, such as a conventional epoxy-based adhesive. In some other implementations, the seal may be a hermetic seal, such as a thin film metal weld or a glass frit. In some other implementations, the seal may include polyisobutylene (PIB), polyurethane, liquid spin-on glass, solder, polymers, plastics, or other materials. In some implementations, a reinforced sealant can be used to form mechanical standoffs.

In alternate implementations, a seal ring may include an extension of either one or both of the backplate 92 or the substrate 20. For example, the seal ring may include a mechanical extension (not shown) of the backplate 92. In some implementations, the seal ring may include a separate member, such as an O-ring or other annular member.

In some implementations, the EMS array 36 and the backplate 92 are separately formed before being attached or coupled together. For example, the edge of the substrate 20 can be attached and sealed to the edge of the backplate 92 as discussed above. Alternatively, the EMS array 36 and the backplate 92 can be formed and joined together as the EMS package 91. In some other implementations, the EMS package 91 can be fabricated in any other suitable manner, such as by forming components of the backplate 92 over the EMS array 36 by deposition.

Many MEMS and EMS devices apply a voltage to generate an electrostatic attraction between two electrodes. The electrostatic attraction between the two electrodes can induce a nonlinear electrostatic force. The electrostatic force can increase quadratically as the distance between the two electrodes decreases.

Figure 7:
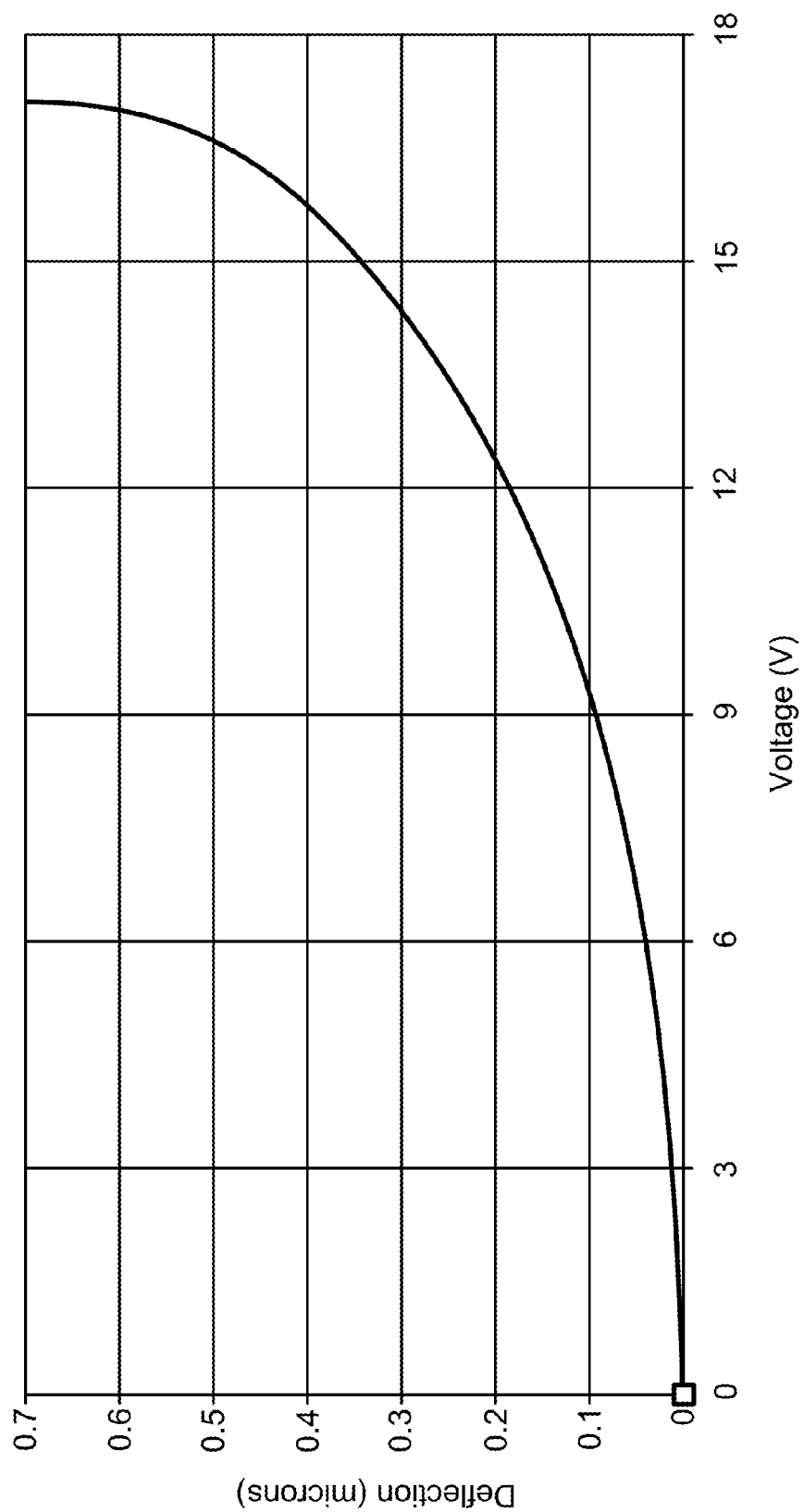
FIG. 7 is an example of a graph illustrating deflection of a movable electrode as a function of applied voltage.

FIG. 7 is an example of a graph illustrating deflection of a movable electrode as a function of applied voltage. The movable electrode can be part of a MEMS or EMS device. The equation below can be used to measure electrostatic force between two electrodes:

$$F = (V^2 \in_0 A_E)/(2D^2)$$

where $A_E$ is the common surface area between the two electrodes, V is the voltage potential between the two electrodes, $\in_0$ is the permittivity of free space, and D is the separate distance between the two electrodes. $D=(z_0-d)$, and $z_0$ is the initial separation distance and d is the deflection distance.

In the example in FIG. 7, the movable electrode is part of a MEMS device with a micromirror or mirror plate. Data for the graph in FIG. 7 was provided in a publication by David M. Burns and Victor M. Bright, "Nonlinear Flexures for stable deflection of an electrostatically actuated micromirror," SPIE Vol. 3226, pp. 125-136 (April 2011), the entirety of which is hereby incorporated by reference. The MEMS device in the Burns publication had a permittivity of free space, $\in_0$, of $8.854 \times 10^{-14}$ F/cm, a common surface area between two electrodes, $A_E$, of 5252 µm², and an initial electrode separation, $z_0$, of 2.09 µm.

Because electrostatic force is inversely proportional to separation distance between two electrodes, and increases quadratically as the separation distance decreases, the position of one of the electrodes can become unstable as the electrode travels across the separation distance. For example, after the separation distance between the electrodes decreases by about one-third, the relative position of the electrodes can become unstable, and the electrodes can quickly travel the remaining separation distance. This phenomenon is called "snap-through," and can limit the useful range of motion in a MEMS or EMS device.

Moreover, as the movable electrode tilts by even the slightest degree, charge can build up in the area of the tilt that serves as a positively reinforcing mechanism, which results in tilt instability. The tilt instability may result from any asymmetry in the MEMS or EMS device, including mismatched tethers, shape of the electrodes, or uneven initial separation distance. Beyond a certain critical travel range or tilt angle, which depends on the ratio of the electrostatic to the mechanical restoring torques, the tilting becomes unstable and one side or corner of the device will snap down. These protrusions also can extend the tilt-stable range by increasing the mechanical restoring torque.

Some MEMS or EMS devices may include optical devices, such as IMODs, as discussed earlier herein. A movable electrode can have a reflective layer configured to move across a gap by electrostatic attraction toward a stationary electrode with an absorber layer. The movable electrode can be configured to interferometrically modulate light of a particular wavelength based at least in part on the size of the gap. Typically, an IMOD can have a stable range from an initial electrical gap at about 540 nm (e.g., green) to about 360 nm (e.g., red). Hence, the IMOD can tune continuously within the red-green-blue (RGB) color spectrum from about 360 nm to about 540 nm. In an analog IMOD (AIMOD), the movable electrode with the reflective layer can be configured to move to three or more different distances from the stationary electrode with the absorber layer. In other words, the reflective layer can move and stop at three or more different positions from the absorber layer.

However, when the movable electrode exceeds a certain critical travel range or title angle, the movable electrode may become unstable and snap-through towards the stationary electrode. This can create an unstable region for various wavelengths of light, including black. Some AIMODs try to extend the stable region of the electrical gap by driving with charge instead of voltage, or add a capacitor in series. Such configurations of AIMODs are still subject to tilt instability, however, where even the slightest tilt in the movable electrode can concentrate electrostatic charge locally and cause the electrostatic force on the movable electrode to increase exponentially.

Figure 8:
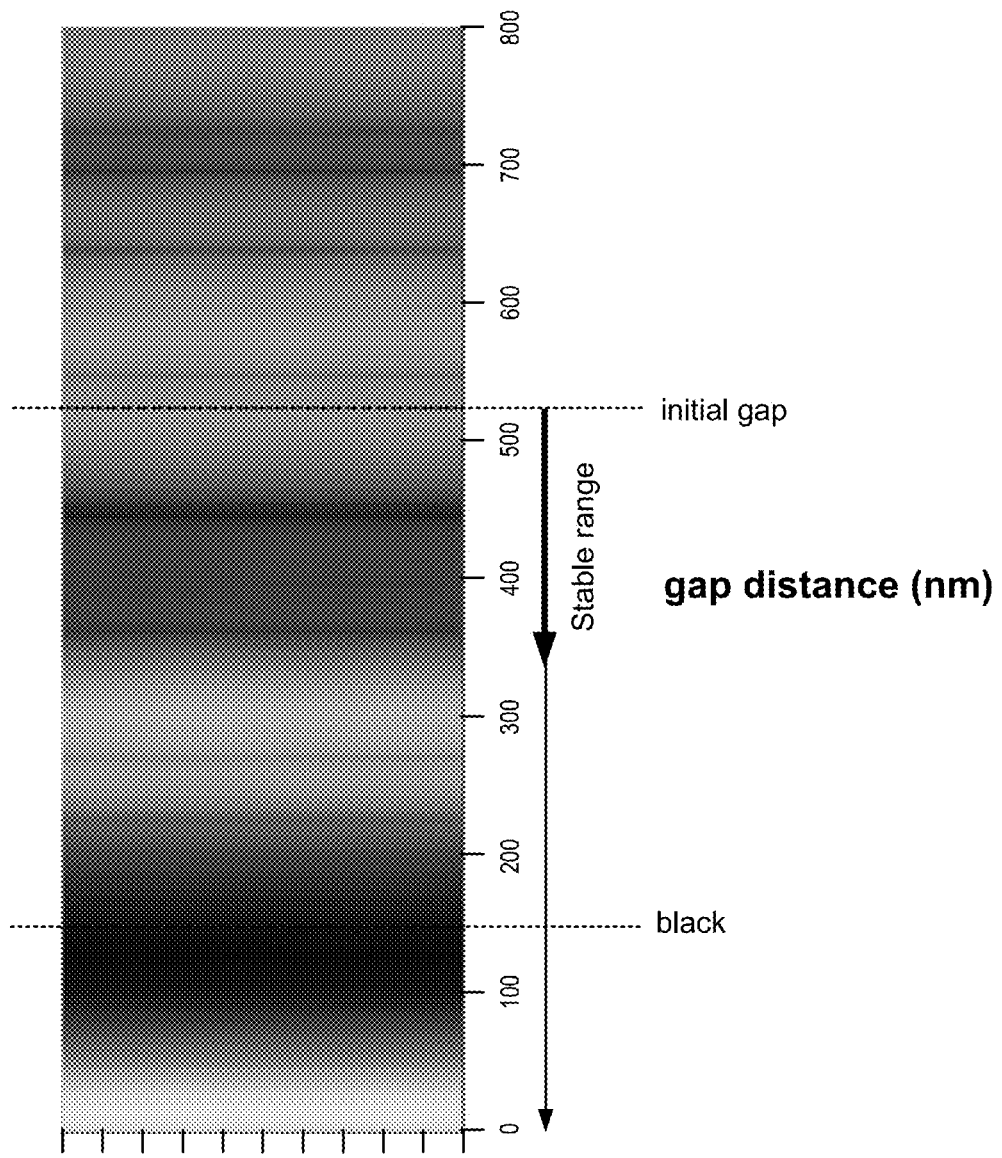
FIG. 8 is an example of a color spectrum illustrating the stable range and black state along a gap distance in an optical EMS device.

FIG. 8 is an example of a color spectrum illustrating the stable range and black state along a gap distance in an optical EMS device. In some implementations, the optical EMS device can include an IMOD. The gap distance measured in nanometers represents the distance from the stationary electrode to the movable electrode. In some implementations, the movable electrode can include a reflective layer and the stationary electrode can include an optical stack with an absorber layer.

To achieve the desired color gamut (e.g., red-green-blue color spectrum) the initial gap distance can be chosen to be between about 400 nm and about 700 nm, such as between about 450 nm and about 650 nm. For example, in the example in FIG. 8, the initial gap distance is chosen to be about 540 nm. The initial gap distance can be chosen so that the desired color gamut is within the stable range of operation before snap-through.

As illustrated in the example in FIG. 8, the black state for the optical EMS device can be outside the stable range. In FIG. 8, the black state can be between about 100 nm and about 200 nm, such as about 140 nm. In some implementations, for an optical EMS device to reach the black state stably, the stable range of the optical EMS device can be increased.

Figure 9:
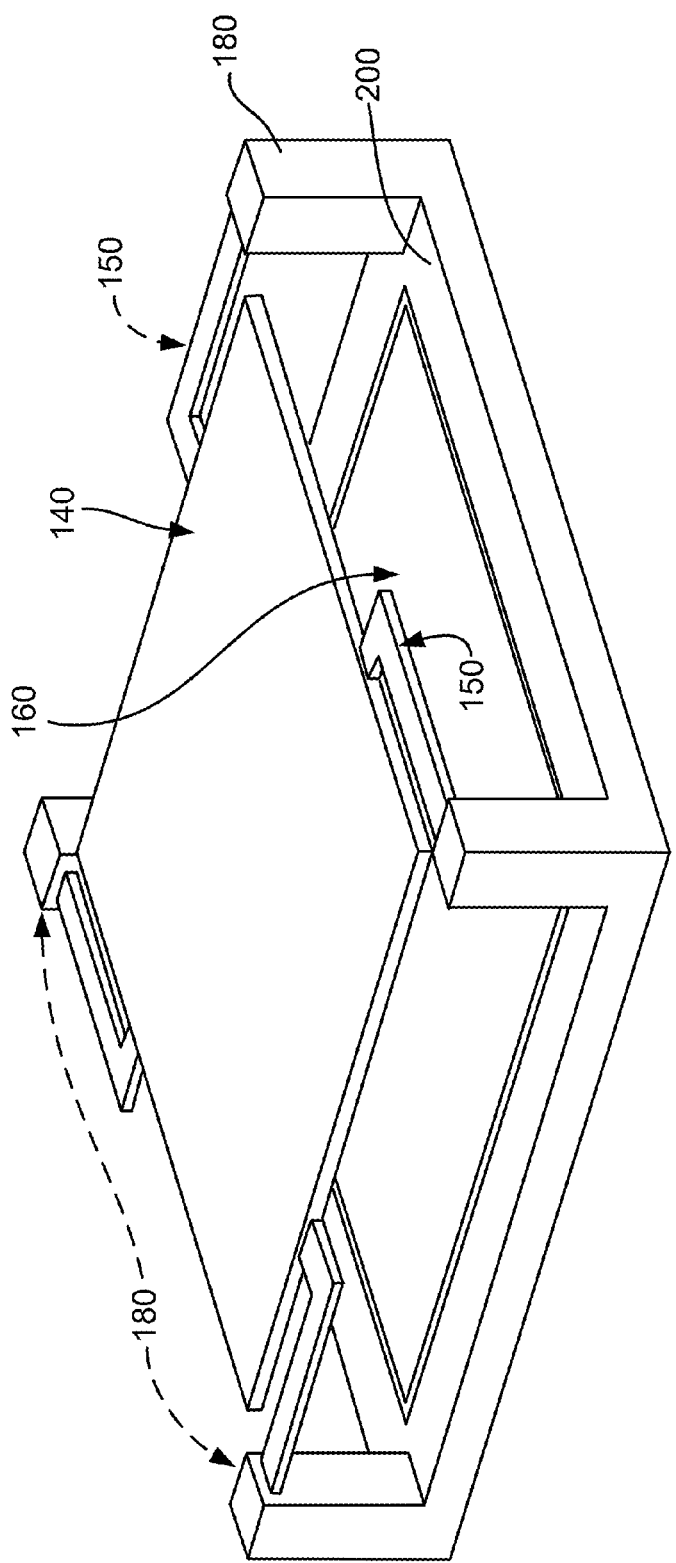
FIG. 9 is a perspective view of an example of an EMS device having a movable electrode and a stationary electrode with a gap therebetween.

FIG. 9 is a perspective view of an example of an EMS device having a movable electrode and a stationary electrode with a gap therebetween. The stationary electrode 160 can be formed on a substrate 200. A plurality of support posts 180 can be disposed over the stationary electrode 160 and at least proximate to the corners of the substrate 200. The movable electrode 140 can be connected to the support posts 180 via a plurality of tethers 150 or hinges symmetrically disposed around the movable electrode 140.

In some implementations, the tethers 150 are tangential to the movable electrode 140 and can reduce the residual stress in the EMS device. Other configurations for tethers 150, including straight, curved, or folded, are also possible. The deflection of the movable electrode 140 towards the stationary electrode 160 can increase as the compliance of the tethers 150 increases. In particular, the compliance of the tethers 150 can vary linearly with the inverse of its width, and can vary directly with the cube of its length. Thus, the tethers 150 can be longer and thinner so as to increase the deflection of the movable electrode 140. Moreover, the tethers 150 can be made of the same material and have substantially the same compliance, which can lead to a substantially uniform deflection for the movable electrode 140. For example, each of the tethers 150 can be made of metals such as aluminum (Al) and titanium (Ti), or other materials such as silicon (Si), oxides, nitrides, and oxynitrides.

In some implementations, the substrate 200 can be a transparent substrate such as glass, plastic, or other transparent material. In some implementations, the substrate 200 can be a glass substrate having a thickness of at least 700 µm. The stationary electrode 160 can be formed on the substrate 200. The stationary electrode 160 can include an optical stack (not shown). The optical stack can include an absorber layer and/or a plurality of other layers, and can be configured similar to the optical stack 16 in FIGS. 3A-3E. The absorber layer can have a thickness between about 20 Å and about 100 Å, and can be made of electrically conductive material such as MoCr.

In some implementations, the movable electrode 140 can be substantially square or rectangular, and positioned directly over the stationary electrode 160. In some implementations, the movable electrode 140 can be between about 4000 Å and about 60000 Å thick. In the example illustrated in FIG. 9, the EMS device with movable electrode 140 can form part of a pixel in a display device.

The movable electrode 140 can include a plurality of layers (not shown), including but not limited to a reflective layer and a deformable layer. In such a configuration, the optical properties of the movable electrode 140 can be decoupled from its mechanical properties. The reflective layer can include a plurality of sub-layers (not shown). For example, the reflective layer can include a dielectric sub-layer having a thickness between about 4000 Å and about 40000 Å to provide structural rigidity to the movable electrode 140, a metal sub-layer having a thickness between about 100 Å and about 500 Å, and a reflective sub-layer having a thickness between about 100 Å and about 500 Å. Furthermore, the deformable layer can include a plurality of sub-layers (not shown). The deformable layer have a thickness between about 2000 Å and about 20000 Å and can include one or more dielectric sub-layers, and a conductive sub-layer having a thickness between about 100 Å and about 500 Å. Each of the dielectric sub-layers described above can include dielectric materials such as nitrous oxide, silicon dioxide, silicon oxynitride, and silicon nitride. Each of the metal or conductive sub-layers described above can include aluminum, copper, aluminum-copper alloy, or other electrically conductive material. Each of the reflective sub-layers described above can include Al, Al alloy, or other reflective material. In some implementations, the reflective layer and the deformable layer of the movable electrode 140 form part of an AIMOD.

The movable electrode 140 is configured to electrostatically actuate towards the stationary electrode 160 when a voltage is applied to the movable electrode 140. Each of the tethers 150 can bend and the movable electrode 140 can deflect towards the stationary electrode 160. If the movable electrode 140 includes a reflective layer and a deformable layer, the deflection for actuation can be undertaken by the deformable layer so as to reduce distortion in the reflective layer from bending in the peripheral regions. The movable electrode 140 remains substantially parallel to the stationary electrode 160 during actuation. However, as applied voltage to the movable electrode 140 increases, the EMS device may have a limited stable range before snap-through.

The movable electrode 140 and the stationary electrode 160 define a gap therebetween, so that in some implementations, a gap distance between the movable electrode 140 and the stationary electrode 160 can influence the reflective properties of the EMS device. The EMS device can move to three or more positions across the gap upon electrostatic actuation, such as in an AIMOD. The AIMOD can be designed to be viewed from the substrate 200 side of the AIMOD, meaning that incident light enters the AIMOD through the substrate 200. Depending on the position of the movable electrode 140, different wavelengths of light are reflected back through the substrate 200, which gives the appearance of different colors.

Figure 10A:
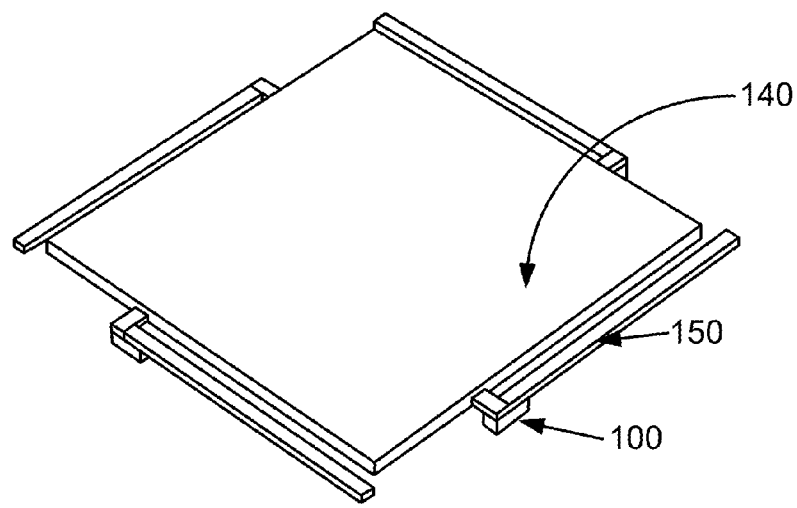
FIG. 10A shows a perspective top view of an example of a movable electrode of an EMS device having a plurality of protrusions.
Figure 10B:
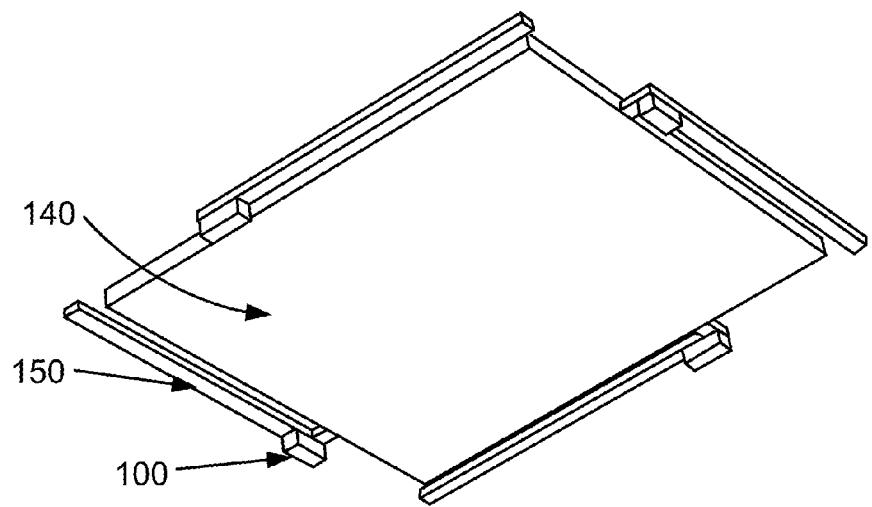
FIG. 10B shows a perspective bottom view of an example of the movable electrode of the EMS device in FIG. 10A.

FIG. 10A shows a perspective top view of an example of a movable electrode of an EMS device having a plurality of protrusions. FIG. 10B shows a perspective bottom view of an example of the movable electrode of the EMS device in FIG. 10A. The protrusions 100 also may be referred to as "dimples." In some implementations as illustrated in the example in FIGS. 10A and 10B, the protrusions 100 can be positioned on tethers 150 symmetrically disposed around the movable electrode 140. The protrusions 100 can connect to and extend from the surface of the tethers 150 facing the stationary electrode 160 or the substrate 200 in FIG. 9.

As the tethers 150 can be symmetrically disposed around the movable electrode 140, the protrusions 100 also can be symmetrically disposed around the movable electrode 140. The protrusions 100 can be rotationally symmetric about the center of the movable electrode 140. Each of the protrusions 100 can be positioned proximate to where the tethers 150 attach to the movable electrode 140. In the example in FIGS. 10A and 10B, four protrusions 100 on tethers 150 are disposed around the periphery of the movable electrode 140. However, it is understood that fewer protrusions 100 or more protrusions 100 can be disposed around the periphery of the movable electrode 140.

The protrusions 100 may be mounted, attached, joined, connected, formed, or otherwise positioned on the tethers 150. The protrusions 100 may be formed as part of and as extensions from the tethers 150 themselves. In some implementations, one or more protrusions 100 may be positioned on the surface of the movable electrode 140 and facing the stationary electrode 160 as discussed in more detail in FIG. 10C. In some implementations, one or more protrusions may be positioned on the surface of the substrate 200 or the stationary electrode 160 as discussed in more detail in FIG. 10D.

Figure 10C:
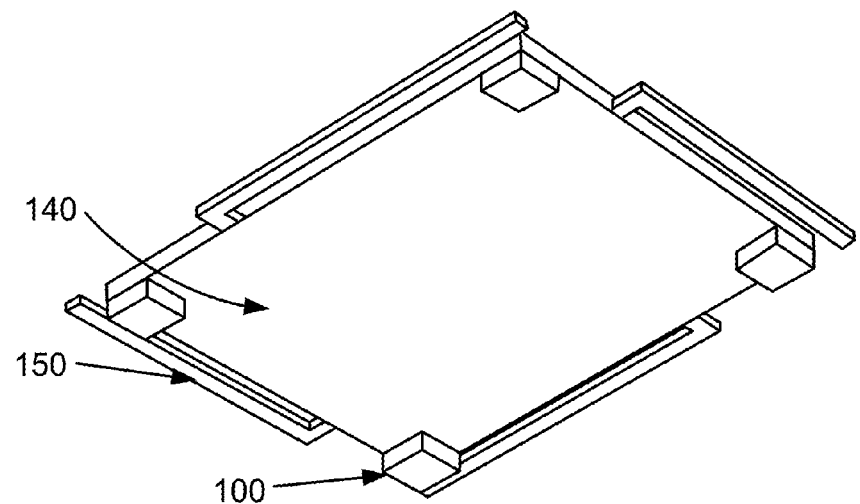
FIG. 10C shows a perspective bottom view of an example of a movable electrode of an EMS device having a plurality of protrusions on the movable electrode.

In some implementations, the protrusions 100 can be positioned on the movable electrode 140 rather than or in addition to the tethers 150. FIG. 10C shows a perspective bottom view of an example of a movable electrode of an EMS device having a plurality of protrusions on the movable electrode. Each of the four protrusions 100 in FIG. 10 can be positioned proximate the corners of the movable electrode 140. The movable electrode 140 can bend in regions between the protrusions 100. In some implementations, the protrusions 100 can be positioned around a center of the movable electrode 140 so that the protrusions 100 can pivot about the center of the movable electrode 140. While three or more protrusions 100 can provide increased stability for the movable electrode 140, it is understood that fewer protrusions can be positioned on the movable electrode 140. For example, one protrusion 100 can be positioned at the center of the bottom surface of the movable electrode 140. In some implementations, the protrusions 100 can be positioned on the movable electrode 140 and the tethers 150.

Figure 10D:
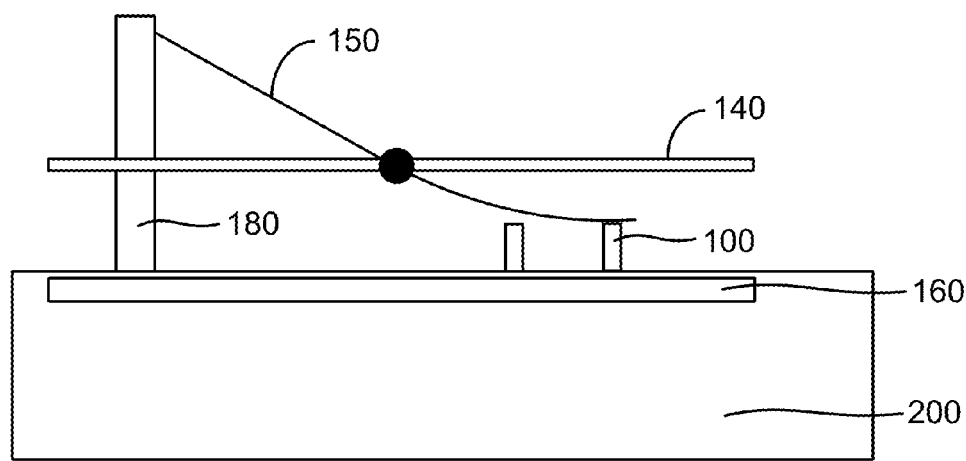
FIG. 10D shows an example of a cross-sectional schematic view of an EMS device with at least one protrusion on the substrate making contact with one of the tethers.

In some implementations, the protrusions 100 can be positioned on the stationary electrode 160 or the substrate 200. FIG. 10D shows an example of a cross-sectional schematic view of an EMS device with at least one protrusion on the substrate making contact with one of the tethers. In the example in FIG. 10D, two protrusions 100 are formed on the substrate 200. As the movable electrode 140 actuates towards the substrate 200, at least one of the protrusions 100 makes contact with one of the tethers 150. As the movable electrode 140 continues to move, the one of the tethers 150 can make contact with a second protrusion 100 on the substrate 200. The tethers 150 may have a non-rigid surface so that when the at least one protrusion 100 makes contact, the region between the at least one protrusion 100 and the support post 180 can bend. In some implementations, the protrusions 100 may make contact with the movable electrode 140 instead of or in addition to the tethers 150.

As discussed earlier herein, when the movable electrode 140 is electrostatically actuated towards the stationary electrode 160 in FIG. 9 or FIG. 10D, the movable electrode 140 may snap-through towards the stationary electrode 160 upon moving beyond the stable range. However, with the protrusions 100 provided on the bottom surface of the tethers 150, on the substrate 200 or the stationary electrode 160, or on the movable electrode 140, the protrusions 100 may make contact with any surface of the EMS device during actuation of the movable electrode 140. Any surface of the EMS device may include but is not limited to the top surface of the substrate 200, the top surface of the stationary electrode 160, the bottom surface of the movable electrode 140, the bottom surface of the tethers 150, and any of the surfaces of the support posts 180.

When any of the protrusions 100 make contact with a surface of the EMS device, the one or more protrusions 100 can increase the overall stiffness of the EMS device. The stiffness of the EMS device increases in effect because the protrusions 100 shorten the effective length of the tethers 150 or movable electrode 140. As discussed earlier herein, the stiffness is approximately cubic with effective length. As a result, the positioning of the protrusions 100 relative to the tethers 150 or movable electrode 140 may vary the stiffness of the EMS device upon contact. In addition, the relative size of the protrusions 100 also may vary the stiffness of the EMS device upon contact. The one or more protrusions 100 provide increased resistance to deformation of the tethers 150 or movable electrode 140. In some implementations, for example, the protrusions 100 change the compliance of the tethers 150 or movable electrode 140 so that the movable electrode 140 continues to move towards the stationary electrode 160 while reducing the effects of snap-through.

The protrusions 100 may be connected to or make contact with a non-rigid surface of the EMS device. For example, in some implementations, the protrusions 100 can be connected to a non-rigid surface of the movable electrode 140 or the tethers 150. As the protrusions 100 make contact with another surface of the EMS device, the protrusions 100 can cause the non-rigid surface to flex. Thus, as the movable electrode 140 continues to move, the regions on the tethers 150 or on the movable electrode 140 where the protrusions 100 are not in contact will effectively bend.

In some implementations, the protrusions 100 may make contact with a non-rigid surface of the movable electrode 140 or tethers 150. The protrusions 100 may be connected to or otherwise positioned on the substrate 200 or the stationary electrode 160, and need not be connected to a non-rigid surface. During actuation, as the protrusions 100 make contact with a non-rigid surface of the movable electrode 140 or the tethers 150 to cause the non-rigid surface to flex. Hence, as the movable electrode 140 continues to move, the regions on the tethers 150 or on the movable electrode 140 where the protrusions 100 are not in contact will effectively bend.

While the protrusions 100 themselves need not be made of compliant or flexible material, the protrusions 100 may be connected to or make contact with a compliant or non-rigid surface of the EMS device. Thus, the protrusions 100 may increase the overall stiffness of the EMS device upon contact with any surface of the EMS device without stopping the EMS device altogether. Rather than having protrusions 100 prevent contact of the movable electrode 140 with the stationary electrode 160, the protrusions 100 change the compliance of the movable electrode 140 and/or tethers 150 while allowing the movable electrode 140 to continue to move even after the protrusions 100 contact a surface of the EMS device. Therefore, upon contact with another surface of the EMS device, protrusions 100 may slow the effects of snap-through by making the movable electrode 140 and/or tethers 150 more resistant to force. Generally, the movable electrode 140 collapses towards the stationary electrode 160 when the electrostatic force is greater than the mechanical restoring force of the tethers 150 and the movable electrode 140. Contact of the protrusions 100 with any surface of the EMS device increases the mechanical restoring force so that the electrostatic force needs to be increased to a greater degree to overcome restoring force. Depending on the size and number of the protrusions 100, the mechanical restoring force can be even larger. Hence, the protrusions 100 can increase the overall stiffness of the system and slow the effects of snap-through, allowing for additional stable regions across the electrical gap.

In some implementations, the thickness or height, h, of the protrusions 100 can be greater than about 20 nm. Generally, the protrusions 100 can have a height greater than the inherent surface roughness or topography of the electrodes. The protrusions 100 also can have a height greater than the dimensions of bumps typically provided primarily for anti-stiction purposes. In some implementations, the height of the protrusions 100 can be between about 20 nm and about 4000 nm (limited by the initial gap distance), such as between about 100 nm and about 200 nm.

The height of the protrusions 100 can depend on the desired stable region of the gap between the movable electrode 140 and the stationary electrode 160. Specifically, the desired gap distance can be stabilized by adjusting the height of the protrusions 100 accordingly. For example, in some implementations, if the height of the protrusions 100 is about 140 nm, then the EMS device can be stabilized at a gap distance of about 140 nm. Thus, the presence of protrusions 100 can create additional stable states across the gap of the EMS device.

In some implementations, each of the protrusions 100 can have a different height. As such, each of the protrusions 100 can contact a surface of the EMS device successively, which can thereby provide additional stable states of operation. For example, one of the protrusions 100 with a first height can provide a first stable state, and another one of the protrusions 100 with a second height different from the first height can provide a second stable state different from the first stable state, and so on. Thus, a taller protrusion 100 can make contact with the EMS device first, and then a shorter protrusion 100 can make contact with the EMS device second, so that at least two stable states can be provided. This can provide a "staircase response" as the applied voltage to the movable electrode 140 increases for a more digital operation of the EMS device.

In some implementations, the EMS device can be a two-terminal or three-terminal device (not shown). In a three-terminal device, the EMS device can include multiple electrodes and multiple gaps. In some implementations, the three-terminal device enables the movable electrode to actuate in two different directions towards two different electrodes, thereby increasing the stable region of operation of the EMS device. For example, the EMS device can include a top electrode over the movable electrode and a bottom electrode below the movable electrode, such that the movable electrode is configured to move across an upper gap by electrostatic actuation between the movable electrode and the top electrode and across a lower gap by electrostatic actuation between the movable electrode and the bottom electrode.

FIGS. 11A-11E are cross-sectional illustrations of various stages in a process of manufacturing an EMS device having a plurality of protrusions.

Figure 11A:
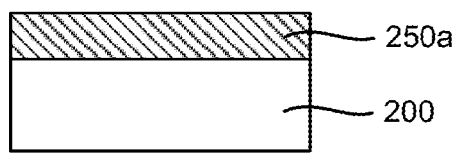
FIGS. 11A-11E are cross-sectional illustrations of various stages in a process of manufacturing an EMS device having a plurality of protrusions.

In the example in FIG. 11A, an implementation of an EMS device with a substrate 200 can be provided. It is understood that the substrate 200 can include one or more layers and sub-layers, such as optical stacks and conductive layers. Each of the layers and sub-layers of the EMS device can be deposited using techniques known in the art, such as physical vapor deposition (PVD), chemical vapor deposition (CVD), plasma-enhanced chemical vapor deposition (PECVD), atomic layer deposition (ALD), and spin-coating. Additionally, each of the layers and sub-layers can be patterned by masking and etching processes known in the art.

The example in FIG. 11A illustrates deposition of sacrificial layer 250a on the substrate 200. The sacrificial layer 250a can be deposited using any of the deposition techniques discussed earlier herein. The formation of sacrificial layer 250a can include deposition of an etchable material such as Mo or amorphous Si. The thickness of the sacrificial layer 250a can be configured to the desired height of one or more protrusions.

Figure 11B:
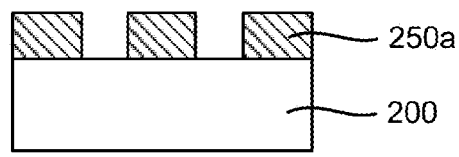

In the example in FIG. 11B, a portion of the sacrificial layer 250a can be etched. The etching process can be performed with one or more patterning, masking, and/or etching processes. Patterning and masking techniques can include photolithography, and etching techniques can include wet etching or dry etching. The portion of the sacrificial layer 250a that is etched defines one or more cavities that correspond to where the one or more protrusions are to be positioned. Thus, the sacrificial layer 250 serves as a mold for the one or more protrusions. It is understood that even though only two cavities are depicted in the example in FIG. 11B, fewer or more cavities can be formed within the sacrificial layer 250a.

Figure 11C:
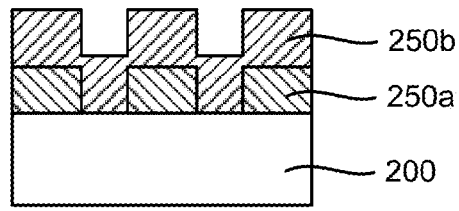

The example in FIG. 11C illustrates deposition of sacrificial layer 250b on sacrificial layer 250a. In some implementations, the material of sacrificial layer 250b can be the same material as sacrificial layer 250a. The sacrificial layer 250b can be deposited using any of the deposition techniques described earlier herein. The thickness of the sacrificial layer 250b can be configured so that the combined thicknesses of the sacrificial layers 250a and 250b establishes a desired initial gap distance from the movable electrode 140 to the substrate 200.

Figure 11D:
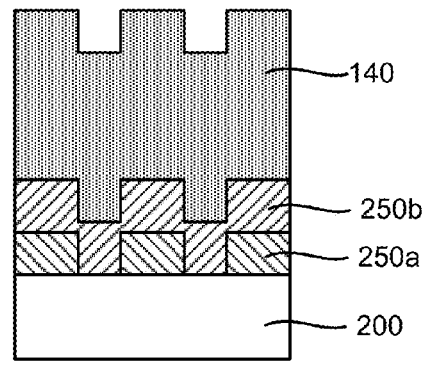

The example in FIG. 11D illustrates deposition of a movable electrode 140 over the sacrificial layer 250b. The movable electrode 140 can be deposited using any of the deposition techniques described earlier herein. The movable electrode 140 can be made of one or more layers and sub-layers, including but not limited to a reflective (e.g., mirror) layer and a deformable layer. In some implementations as illustrated in the example in FIG. 11D, the movable electrode 140 can include protrusions 100 extending from a surface of the movable electrode 140 facing the substrate 200. Hence, the protrusions 100 can be made of the same material as the movable electrode 140. In some implementations, for example, the protrusions 100 and the movable electrode 140 can be made of Al or Al alloy. The compliance of the movable electrode 140 may vary according to the designed width, length, and position of the protrusions 100.

Figure 11E:
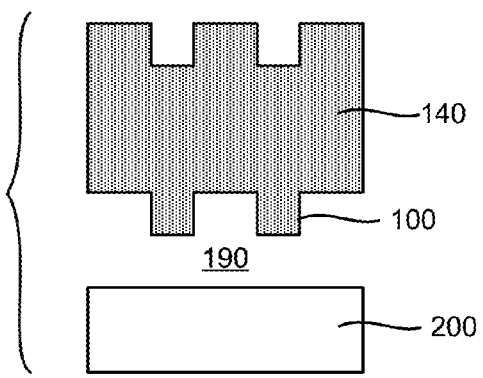

The example in FIG. 11E illustrates removal of sacrificial layers 250a and 250b to release the movable electrode 140. A cavity 190 is formed upon exposing sacrificial layers 250a and 250b to an etchant. The cavity 190 has a desired initial gap distance between the movable electrode 140 and the substrate 200. After removal of the sacrificial layers 250a and 250b, the movable electrode 140 is movable across the cavity 190. As the movable electrode 140 travels across the cavity 190 towards the substrate 200, the protrusions 100 contact the substrate 200 so that the height of the protrusions 100 positions the movable electrode 140 at a stable state.

Figure 12:
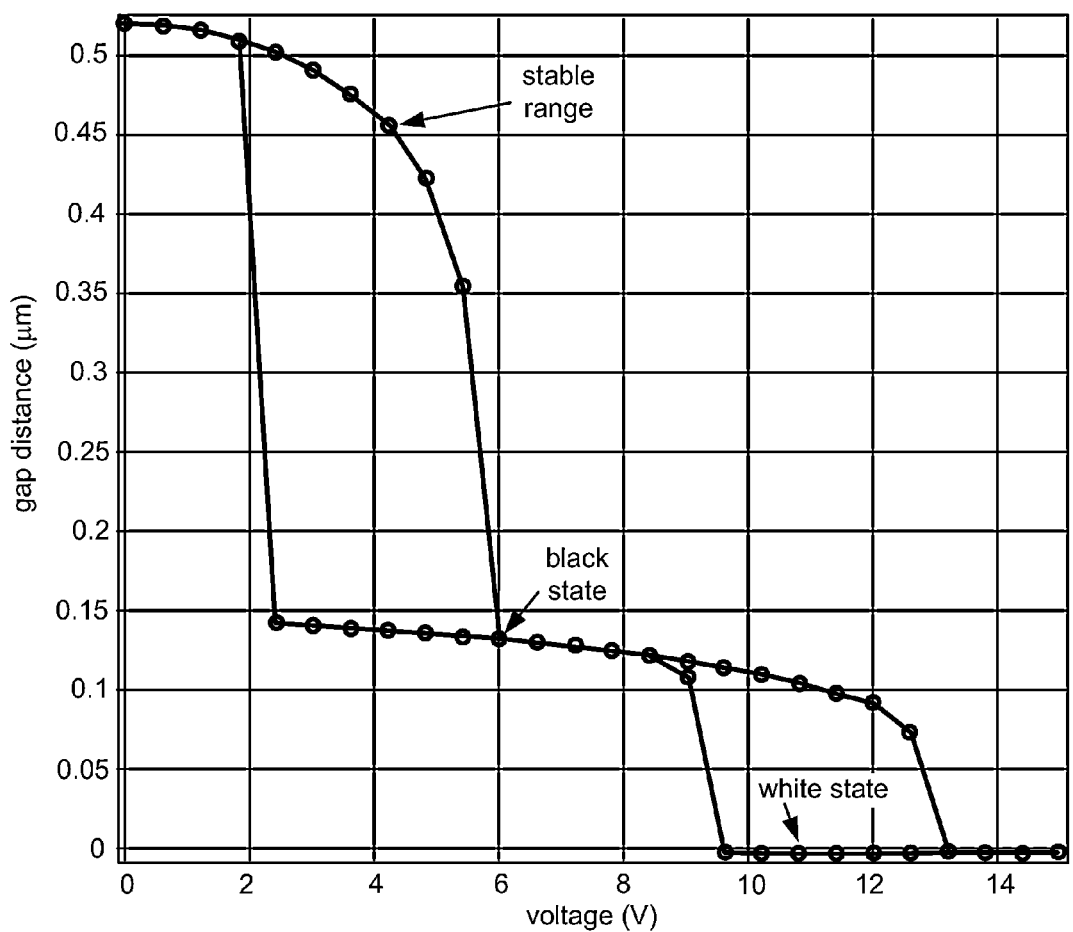
FIG. 12 is an example of a graph illustrating a hysteresis curve for a position of a movable electrode as a function of applied voltage of an EMS device.

FIG. 12 is an example of a graph illustrating a hysteresis curve for a position of a movable electrode as a function of applied voltage of an EMS device. In some implementations, the EMS device is part of an optical device. The EMS device can have one or more protrusions as described earlier herein. The protrusions may be configured to provide a stable color range corresponding at least in part to the heights of the protrusions. FIG. 12 is an example of the gap distance between a movable electrode and a stationary electrode of an IMOD as a function of applied voltage (V). Each of the data points provided in the hysteresis curve can correspond to a different color state.

The IMOD has a hysteresis property providing ranges in which the IMOD is stable. Between about 0 V and 6 V, the gap is relatively stable between about 540 nm and about 360 nm. This relatively stable range can provide access to a broad color gamut for the IMOD, including the red-green-blue color spectrum. However, when about 6 V is applied, the gap distance decreases substantially until about 140 nm. Between about 6 V and 13 V, the IMOD remains relatively stable in this range, which provides a stable black state. In other words, the movable electrode is not as sensitive to changes in voltage within this range. In this range, one or more protrusions provided on the movable electrode or tethers of the IMOD are in contact with a surface of the IMOD, such as the top surface of the substrate or the stationary electrode. In some implementations, the one or more protrusions may be provided on the substrate or stationary electrode to contact a surface of the movable electrode or tethers. Beyond 13 V, the gap distance decreases substantially until the IMOD reaches another stable state, which can be a white state. At this state, the movable electrode and the stationary electrode can be substantially closed so that the gap distance is almost or about 0 nm.

When the voltage is reduced from that value, the movable electrode remains in this stable state (such as the white state) until the voltage drops back below about 10 V. As the voltage is reduced from about 10V, between about 9 V and about 2 V, the movable electrode is stabilized in another stable state, which can be the black state. When the applied voltage is reduced to less than about 2 V, the gap distance increases substantially until the movable electrode reaches near the initial gap distance, which can be about 540 nm.

Figure 13:
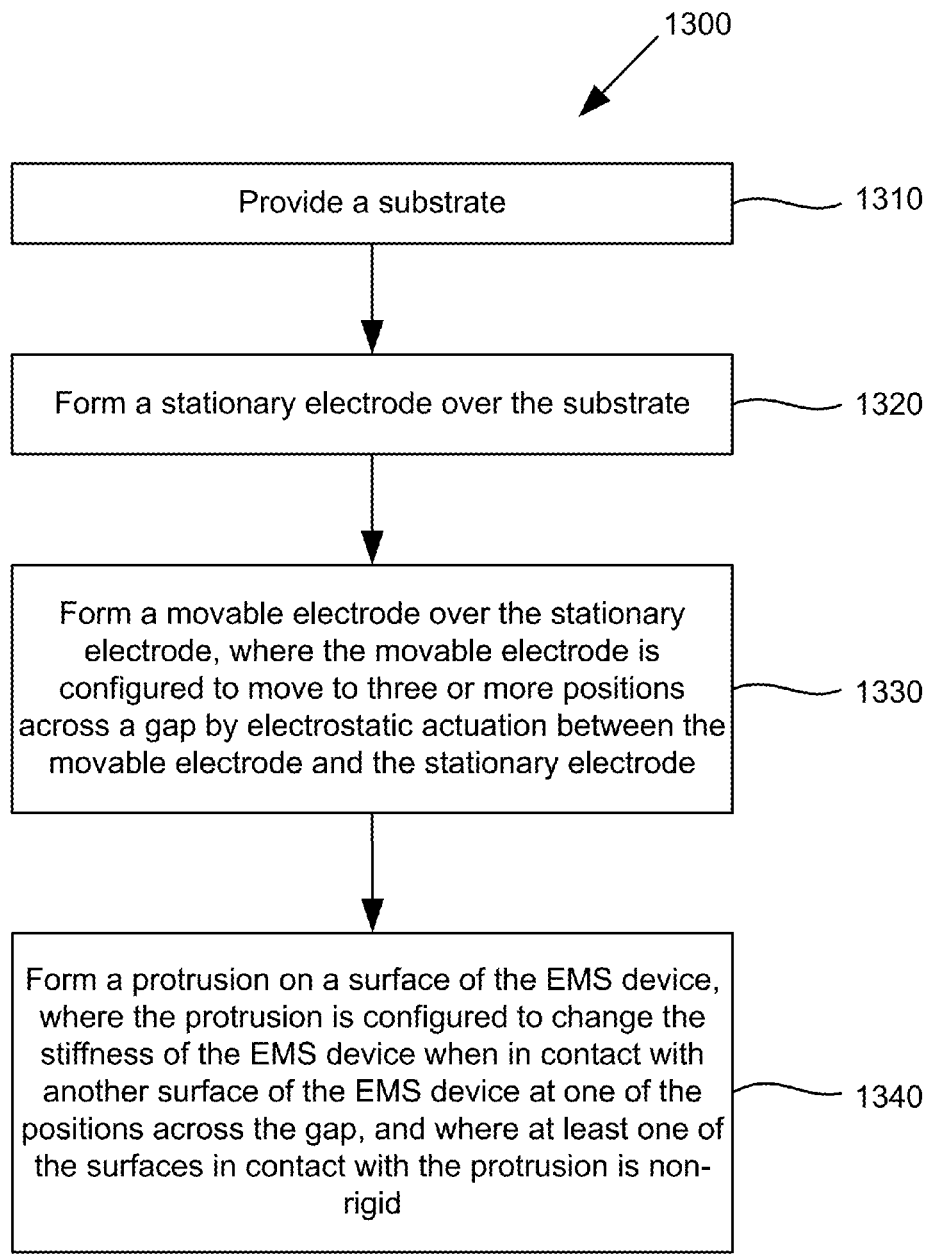
FIG. 13 is a flow diagram illustrating a method of manufacturing an EMS device.

FIG. 13 is a flow diagram illustrating a method of manufacturing an EMS device. It will be understood that additional processes may be present. For example, deposition of additional underlying or overlying layers can be achieved by various film deposition processes, such as PVD, PECVD, thermal CVD, ALD, spin-on coating, and electroplating. Patterning techniques, such as photolithography, can be used to transfer patterns on a mask to a layer of material. Etching processes can be performed after patterning to remove unwanted materials. Planarization processes such as "etch back" and chemical mechanical polishing (CMP) can be employed to create a substantially flat surface for further processing.

The process 1300 begins at block 1310 where a substrate is provided. As discussed earlier herein the substrate can be formed of a substantially transparent material, such as glass or plastic. In some implementations, the substrate 200 can be a glass substrate having a thickness of at least 700 µm.

The process 1300 continues at block 1320 where a stationary electrode is formed over the substrate. In some implementations, the stationary electrode can include an optical stack. The optical stack can include an absorber and/or a plurality of other layers and/or sub-layers. The absorber can include electrically conductive material.

The process 1300 continues at block 1330 where a movable electrode is formed over the stationary electrode. The movable electrode is configured to move to three or more positions across a gap by electrostatic actuation between the movable electrode and the stationary electrode. In some implementations, a plurality of tethers can be formed that are symmetrically disposed around the edges of the movable electrode.

The process continues at block 1340 where a protrusion is formed on a surface of the EMS device. The protrusion is configured to change the stiffness of the EMS device when in contact with another surface of the EMS device at one of the positions across the gap. At least one of the surfaces in contact with the protrusion is non-rigid. In some implementations, the protrusion can be connected to at least one of the tethers. In some implementations, the protrusion can be part of a plurality of protrusions, where each of the protrusions is connected to each of the tethers. In some implementations, the protrusion can be connected to a surface of the movable electrode. In some implementations, the protrusion can be connected to or otherwise positioned on the substrate or stationary electrode. In some implementations, the protrusion can have a height greater than about 20 nm. Typically, the protrusion can have a height greater than the inherent surface roughness of the electrodes and greater than the dimensions of bumps provided primarily for anti-stiction purposes.

Figure 14A:
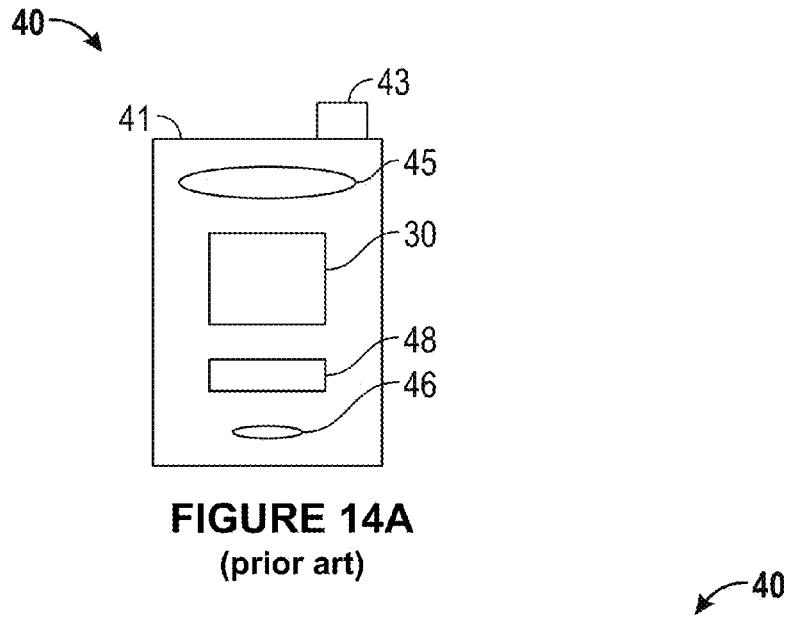
FIGS. 14A and 14B are system block diagrams illustrating a display device that includes a plurality of IMOD display elements.
Figure 14B:
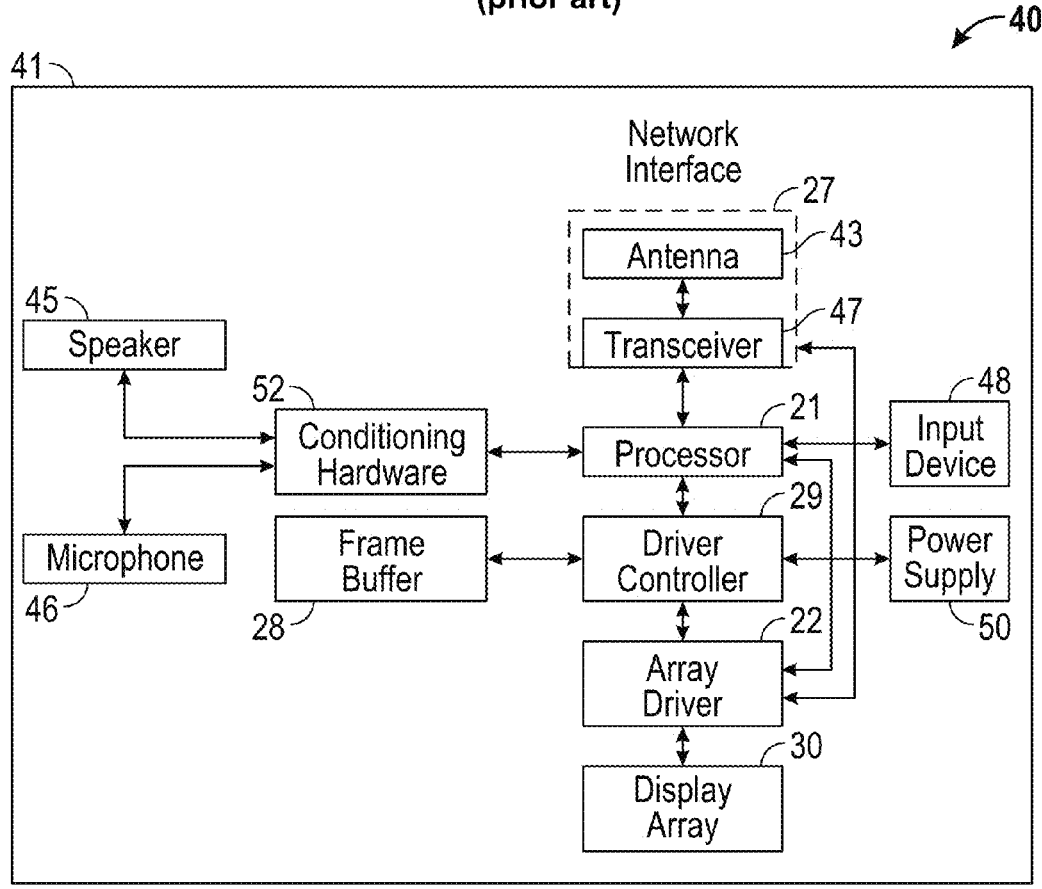

FIGS. 14A and 14B are system block diagrams illustrating a display device 40 that includes a plurality of IMOD display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 14A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 14A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An electromechanical systems (EMS) device, comprising:
a substrate;
a stationary electrode over the substrate;
a movable electrode over the stationary electrode and configured to move to three or more positions across a gap by electrostatic actuation between the movable electrode and the stationary electrode;
a plurality of tethers symmetrically disposed around the edges of the movable electrode; and
a plurality of protrusions connected to and protruding from a first surface of the EMS device, the plurality of protrusions rotationally symmetric about a center of the movable electrode, wherein the movable electrode is configured to continue moving closer towards the stationary electrode when any of the protrusions makes contact with a second surface of the EMS device opposite the first surface during actuation, wherein the first surface includes one of: a surface of the substrate facing the movable electrode, a surface of the movable electrode facing the substrate, and a surface of the plurality of tethers facing the substrate,
wherein at least one of the first surface and the second surface of the EMS device is non-rigid.

2. The EMS device of claim 1, further comprising a plurality of posts over the substrate, wherein the movable electrode is connected to the plurality of posts by the plurality of tethers.

3. The EMS device of claim 1, wherein the movable electrode includes a reflective layer having a rigid surface and the plurality of tethers includes a plurality of hinges each having a non-rigid surface.

4. The EMS device of claim 1, wherein each of the protrusions is connected to the surface of the movable electrode facing the stationary electrode.

5. The EMS device of claim 1, wherein each of the protrusions is connected to the surface of the substrate facing the movable electrode.

6. The EMS device of claim 1, wherein each of the protrusions is connected to the surface of the tethers facing the substrate.

7. The EMS device of claim 1, wherein the EMS device is part of an optical device.

8. The EMS device of claim 7, wherein the EMS device is part of an analog interferometric modulator (AIMOD).

9. The EMS device of claim 8, wherein the three or more positions across the gap correspond to different visible wavelengths in each of the positions, wherein one of the positions across the gap is defined at least in part by the height of at least one of the protrusions.

10. The EMS device of claim 8, wherein the plurality of protrusions define a plurality of positions across the gap corresponding to a stable color range when at least one of the protrusions makes contact with the second surface of the EMS device during actuation.

11. The EMS device of claim 1, wherein each of the protrusions has a height greater than about 20 nm.

12. The EMS device of claim 11, wherein each of the protrusions has a height between about 100 nm and about 200 nm.

13. The EMS device of claim 1, wherein each of the protrusions has a different height.

14. The EMS device of claim 1, further comprising a top electrode over the movable electrode, wherein the movable electrode is configured to move across an upper gap by electrostatic actuation between the movable electrode and the top electrode.

15. The EMS device of claim 1, wherein the EMS device forms a display, the display including:
a processor that is configured to communicate with the display, the processor being configured to process image data; and
a memory device that is configured to communicate with the processor.

16. The EMS device of claim 15, further comprising:
a driver circuit configured to send at least one signal to the display; and
a controller configured to send at least a portion of the image data to the driver circuit.

17. The EMS device of claim 15, further comprising:
an image source module configured to send the image data to the processor, wherein the image source module comprises at least one of a receiver, transceiver, and transmitter.

18. The EMS device of claim 15, further comprising:
an input device configured to receive input data and to communicate the input data to the processor.

19. An electromechanical systems (EMS) device, comprising:
a substrate;
a stationary electrode over the substrate;
a movable electrode over the stationary electrode and configured to move to three or more positions across a gap by electrostatic actuation between the movable electrode and the stationary electrode;
means for supporting the movable electrode over the substrate;
means for tethering the movable electrode to the supporting means and symmetrically disposed around the edges of the movable electrode; and
means for protruding from a first surface of the EMS device, the protruding means being rotationally symmetric about a center of the movable electrode, wherein the movable electrode is configured to continue moving closer towards the stationary electrode when the protruding means makes contact with a second surface of the EMS device opposite the first surface during actuation, wherein the first surface includes one of: a surface of the substrate facing the movable electrode, a surface of the movable electrode facing the substrate, and a surface of the tethering means facing the substrate,
wherein at least one of the first surface and the second surface of the EMS device is non-rigid.

20. The EMS device of claim 19, wherein the protruding means is connected to the surface of the movable electrode facing the stationary electrode.

21. The EMS device of claim 19, wherein the protruding means is connected to the surface of the substrate facing the movable electrode.

22. The EMS device of claim 19, wherein the protruding means is connected to the surface of the tethering means facing the substrate.

23. The EMS device of claim 19, wherein the protruding means has a height greater than about 20 nm.

24. A method of manufacturing an electromechanical systems (EMS) device, comprising:
providing a substrate;
forming a stationary electrode over the substrate;
forming a movable electrode over the stationary electrode, wherein the movable electrode is configured to move to three or more positions across a gap by electrostatic actuation between the movable electrode and the stationary electrode;

forming a plurality of tethers symmetrically disposed around the edges of the movable electrode; and forming a plurality of protrusions connected to and protruding from a first surface of the EMS device, the plurality of protrusions rotationally symmetric about a center of the movable electrode, wherein the movable electrode is configured to continue moving closer towards the stationary electrode when any of the protrusions makes contact with a second surface of the EMS device opposite the first surface during actuation, wherein the first surface includes one of: a surface of the substrate facing the movable electrode, a surface of the movable electrode facing the substrate, and a surface of the plurality of tethers facing the substrate, wherein at least one of the first surface and the second surface of the EMS device is non-rigid.

25. The method of claim 24, wherein each of the protrusions is connected to the surface of the movable electrode facing the stationary electrode.

26. The method of claim 24, wherein each of the protrusions is connected to the surface of the substrate facing the movable electrode.

27. The method of claim 24, wherein each of the protrusions has a height greater than about 20 nm.

* * * * *